United States Patent
Daley et al.

(10) Patent No.: US 10,177,672 B2
(45) Date of Patent: Jan. 8, 2019

(54) VOLTAGE REGULATION FOR MULTI-PHASE POWER SYSTEMS

(71) Applicant: COOPER TECHNOLOGIES COMPANY, Houston, TX (US)

(72) Inventors: Daniel Joseph Daley, Waukesha, WI (US); Daniel Michael Sauer, Port Washington, WI (US); Fred Joseph Rapant, South Milwaukee, WI (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 0 days.

(21) Appl. No.: 15/480,784

(22) Filed: Apr. 6, 2017

(65) Prior Publication Data
US 2017/0294846 A1    Oct. 12, 2017

Related U.S. Application Data

(60) Provisional application No. 62/320,064, filed on Apr. 8, 2016.

(51) Int. Cl.
*H02M 5/12* (2006.01)
*H01F 38/38* (2006.01)
*H01F 29/02* (2006.01)

(52) U.S. Cl.
CPC ............ *H02M 5/12* (2013.01); *H01F 29/025* (2013.01); *H01F 38/38* (2013.01)

(58) Field of Classification Search
CPC ... G05F 1/14; G05F 1/153; G05F 1/16; G05F 1/20; H02P 13/00; H02P 13/06;
(Continued)

(56) References Cited

U.S. PATENT DOCUMENTS 5,003,277 A * 3/1991 Sokai ...................... H01F 30/12
                                                        363/160
5,408,171 A * 4/1995 Eitzmann ................. G05F 1/16
                                                        323/258
(Continued)

OTHER PUBLICATIONS

The International Search Report and Written Opinion From Corresponding Application No. PCT/US2017/026325, dated Aug. 14, 2017, 6 pages.

*Primary Examiner* — Alex Torres-Rivera
(74) *Attorney, Agent, or Firm* — King & Spalding LLP

(57) ABSTRACT

A power system can include a first tap changer for a first regulated transformer, where the first tap changer has a plurality of first positions. The power system can also include a second tap changer for a second regulated transformer, where the second tap changer has a plurality of second positions. The power system can further include at least one first instrument transformer coupled to the first regulated transformer. The power system can also include at least one second instrument transformer coupled to the second regulated transformer. The power system can further include a controller coupled to the at least one first instrument transformer and the at least one second instrument transformer, where the controller adjusts the first tap changer to a first adjusted position among the first positions based on the first measurements of the first regulated transformer and the second measurements of the second regulated transformer.

19 Claims, 20 Drawing Sheets

(58) Field of Classification Search
CPC .......... H02M 5/00; H02M 5/12; H01F 21/12; H01F 27/29; H01F 38/38; H01F 29/02; H01F 29/025; H01H 9/0005; H01H 9/0011; H01H 9/0016; H01H 2009/0061
USPC .......... 323/215, 247, 328, 361; 363/64, 153, 363/171; 307/7, 83
See application file for complete search history.

(56) References Cited

U.S. PATENT DOCUMENTS

| | | | |
|---|---|---|---|
| 6,351,106 B1* | 2/2002 | Kramer | .............. H01F 29/02 |
| | | | 323/258 |
| 7,737,667 B2* | 6/2010 | Raedy | ................ G05F 1/153 |
| | | | 323/258 |
| 8,400,778 B2 | 3/2013 | Hsing et al. | |
| 8,850,233 B2 | 9/2014 | Su et al. | |
| 2011/0051479 A1 | 3/2011 | Breen et al. | |
| 2013/0229158 A1* | 9/2013 | Daley | .................. G05F 1/14 |
| | | | 323/255 |
| 2013/0234696 A1* | 9/2013 | Bryson | ................. G06F 1/26 |
| | | | 323/340 |

* cited by examiner

VOLTAGE REGULATION FOR MULTI-PHASE POWER SYSTEMS

CROSS-REFERENCE TO RELATED APPLICATIONS

This application claims priority under 35 U.S.C. § 119 to U.S. Provisional Patent Application Ser. No. 62/320,064, titled "Voltage Regulation For Multi-Phase Power Systems" and filed on Apr. 8, 2016, the entire contents of which are hereby incorporated herein by reference.

TECHNICAL FIELD

Embodiments described herein relate generally to multi-phase power systems, and more particularly to managed multi-phase voltage regulation and control in a multi-phase power system.

BACKGROUND

Multi-phase power systems are a common form of power distribution. In such systems, there are two or more lines, where each line carries a phase of alternating current (AC) power. Each phase is typically offset (e.g., by 120°) from the other phases. This allows multi-phase systems to transmit more power compared to single phase power systems. A typical example of a multi-phase system is a three-phase electric power system. In a multi-phase system, a tap changer is used for each phase to maintain local operational control of individual phases to adjust for imbalanced loading on that system. The tap changer is capable of changing a tap position of the voltage regulator, providing variable/stepped voltage output regulation associated with a respective phase. In certain systems currently known in the art, the presence of imbalanced loads can be exacerbated when employment of a tap changer is not performed properly and/or when the tap changer is not moved in an efficient manner.

SUMMARY

In general, in one aspect, the disclosure relates to a power system that includes a first tap changer for a first regulated transformer, where the first tap changer has a plurality of first positions. The power system can also include a second tap changer for a second regulated transformer, where the second tap changer has a plurality of second positions. The power system can further include at least one first instrument transformer coupled to the first regulated transformer, where the at least one first instrument transformer harvests a plurality of first measurements of the first regulated transformer. The power system can also include at least one second instrument transformer coupled to the second regulated transformer, where the at least one second instrument transformer harvests a plurality of second measurements of the second regulated transformer. The power system can further include a controller coupled to the at least one first instrument transformer and the at least one second instrument transformer, where the controller adjusts the first tap changer from a first position to a first adjusted position among the plurality of first positions based on the plurality of first measurements of the first regulated transformer and the plurality of second measurements of the second regulated transformer.

In another aspect, the disclosure can generally relate to a metering system that includes a first tap changer for a first regulated transformer, where the first tap changer has a plurality of first positions. The metering system can also include a second tap changer for a second regulated transformer, where the second tap changer has a plurality of second positions. The metering system can further include at least one first instrument transformer coupled to the first regulated transformer, where the at least one first instrument transformer harvests a plurality of first measurements of the first regulated transformer. The metering system can also include at least one second instrument transformer coupled to the second regulated transformer, where the at least one second instrument transformer harvests a plurality of second measurements of the second regulated transformer. The metering system can further include a controller coupled to the at least one first instrument transformer and the at least one second instrument transformer, where the controller calculates multi-phase power measurements based on the plurality of first measurements of the first regulated transformer and the plurality of second measurements of the second regulated transformer.

In yet another aspect, the disclosure can generally relate to a method for regulating voltage of a plurality of regulated transformers. The method can include receiving, by a controller from at least one first instrument transformer coupled to a first regulated transformer of the plurality of regulated transformers, a plurality of first measurements of the first regulated transformer. The method can also include receiving, by the controller from at least one second instrument transformer coupled to a second regulated transformer of the plurality of regulated transformers, a plurality of second measurements of the second regulated transformer. The method can further include determining, by the controller, that at least one first measurement of the plurality of first measurements is outside of a range of operating values. The method can also include adjusting, by the controller, a first tap changer of the first regulated transformer from a first position to a first adjusted position among a plurality of first positions based on the plurality of first measurements of the first regulated transformer and the plurality of second measurements of the second regulated transformer.

These and other aspects, objects, features, and embodiments will be apparent from the following description and the appended claims.

BRIEF DESCRIPTION OF THE DRAWINGS

The drawings illustrate only example embodiments of voltage regulation for multi-phase power systems and are therefore not to be considered limiting of its scope, as voltage regulation for multi-phase power systems may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION OF EXAMPLE EMBODIMENTS

Figure 1A:
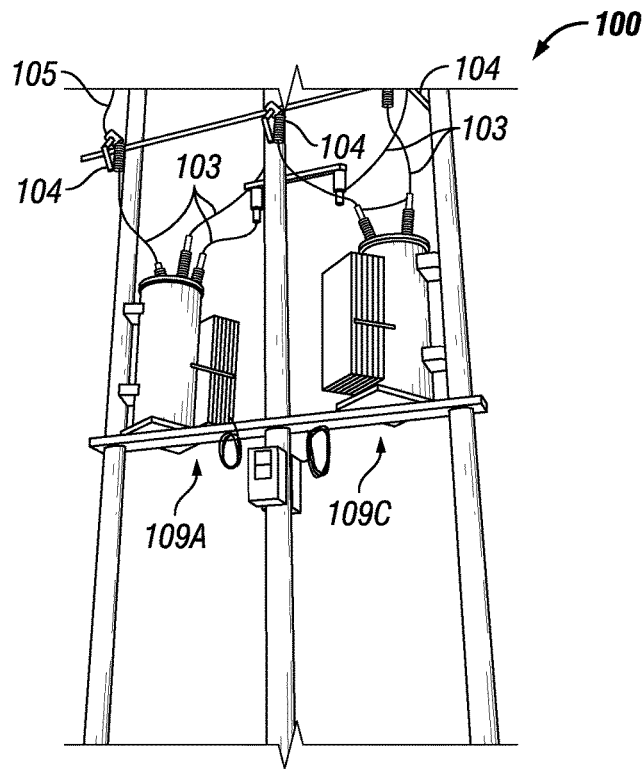
FIGS. 1A and 1B show a three phase power system in which two phases are regulated in accordance with certain example embodiments.

The example embodiments discussed herein are directed to systems, methods, and devices for regulating multi-phase power systems. Example embodiments can be used for a power system having any of a number of configurations (e.g., open delta, closed delta, grounded wye). Further, example embodiments can be used with power systems having any of a number (e.g., two, three) of phases. Example embodiments allow for efficient regulation of multi-phase power systems, which takes into account both phase-to-phase and phase-to-neutral voltages, along with the associated phase angle balancing.

A user may be any person that interacts with voltage regulation for multi-phase power systems. Specifically, a user may program, operate, and/or interface with one or more components (e.g., a controller) associated with voltage regulation for multi-phase power systems. Examples of a user may include, but are not limited to, an engineer, an electrician, an instrumentation and controls technician, a lineman, a mechanic, an operator, a consultant, a contractor, and a manufacturer's representative.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

In the foregoing figures showing example embodiments of voltage regulation for multi-phase power systems, one or more of the components shown may be omitted, repeated, and/or substituted. Accordingly, example embodiments of voltage regulation for multi-phase power systems should not be considered limited to the specific arrangements of components shown in any of the figures. For example, features shown in one or more figures or described with respect to one embodiment can be applied to another embodiment associated with a different figure or description. As a specific example, a potential transformer can be used in an example embodiment described below, even though no potential transformer is shown or described for that particular embodiment.

Example embodiments of voltage regulation for multi-phase power systems will be described more fully hereinafter with reference to the accompanying drawings, in which example embodiments of voltage regulation for multi-phase power systems are shown. Voltage regulation for multi-phase power systems may, however, be embodied in many different forms and should not be construed as limited to the example embodiments set forth herein. Rather, these example embodiments are provided so that this disclosure will be thorough and complete, and will fully convey the scope of voltage regulation for multi-phase power systems to those of ordinary skill in the art. Like, but not necessarily the same, elements (also sometimes called components) in the various figures are denoted by like reference numerals for consistency.

Terms used herein such as, but not limited to, "A", "B", "C", "A-B", "B-C", "C-A", "first", "second", and "third" are used merely to distinguish one component (or part of a component or state of a component) from another. Such terms are not meant to denote a preference or a particular orientation. Also, the names given to various components described herein are descriptive of one or more embodiments and are not meant to be limiting in any way. Those of ordinary skill in the art will appreciate that a feature and/or component shown and/or described in one embodiment (e.g., in a figure) herein can be used in another embodiment (e.g., in any other figure) herein, even if not expressly shown and/or described in such other embodiment.

Figure 1B:
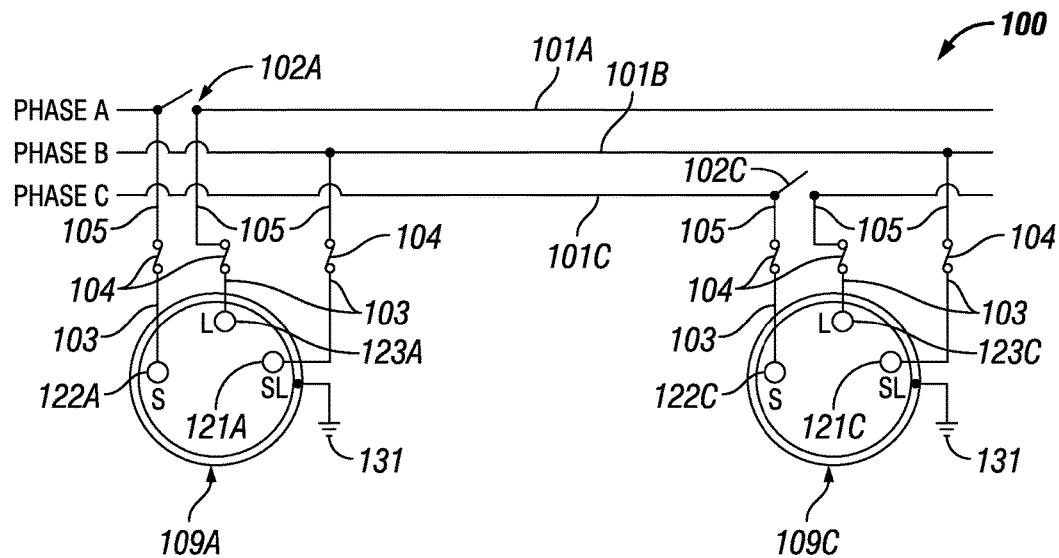

FIGS. 1A and 1B show a three phase power system 100 in which two phase-to-phase voltages are regulated in accordance with certain example embodiments. Specifically, FIG. 1A shows a bottom perspective view of the system 100, and FIG. 1B shows a schematic diagram of the system 100. The system 100 can include one or more of a number of components. For example, as shown in FIGS. 1A and 1B, the system 100 can include a number (e.g., one, two (as in this case), three) regulated transformers 109, one or more (in this case three) main power lines 101, one or more (in this case, two) bypass switches, one or more (in this case, six) primary feeder lines 105, one or more (in this case, six) disconnect switches 104, one or more (in this case, six) secondary feeder lines 103, and a ground 131.

Each regulated transformer 109 (in this case, regulated transformer 109A, regulated transformer 109C) can regulate a phase-to-phase voltage (as in this case) or a phase-to-neutral voltage (as in FIGS. 9 and 10 below). Each regulated transformer 109 can include one or more of a number of features. For example, each regulated transformer 109 can have one or more of a number of terminals. In this case, each regulated transformer 109 has a source terminal 122 (also called terminal S 122), a load terminal 123 (also called terminal L 123), and a source-load terminal 121 (also called terminal SL 121). Specifically, regulated transformer 109A has terminal SL 121A, terminal S 122A, and terminal L 123A, and regulated transformer 109C has terminal SL 121C, terminal S 122C, and terminal L 123C.

A regulated transformer 109 (or set of regulated transformers 109) can also include one or more of a number of other features and/or components. Examples of such other features and/or components can include, but are not limited to, one or more instrument transformers (e.g., potential transformers, current transformers), at least one tap changer for at least one winding of a transformer, and an example controller, all as described below.

Figure 2:
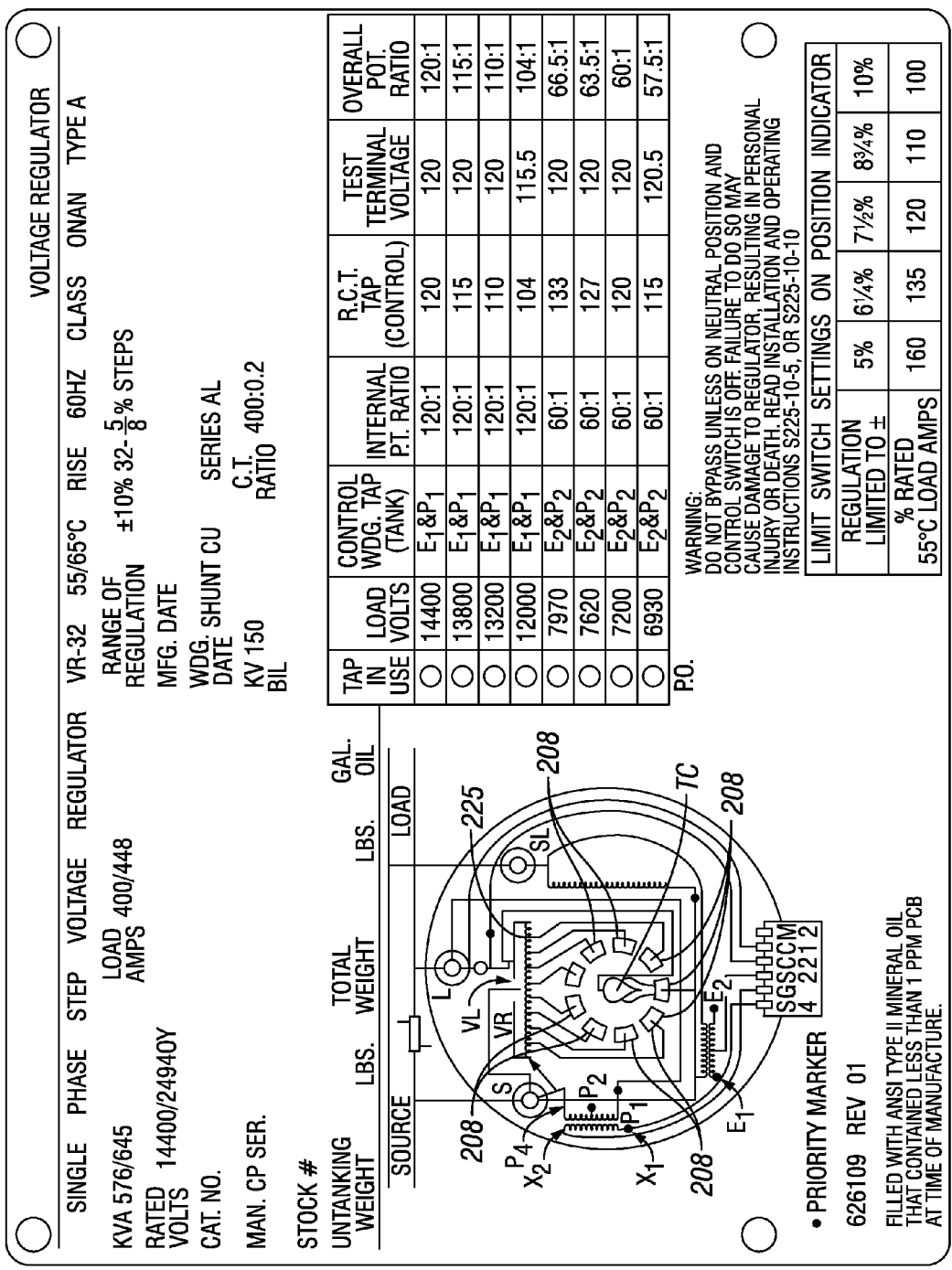
FIG. 2 shows a nameplate which includes reference to the tap changer of a voltage regulator in accordance with certain example embodiments.

FIG. 2 shows nameplate containing a schematic diagram of a tap changer 206 of a voltage regulator in accordance with certain example embodiments. The tap changer 206 can include a selector TC that electrically couples to one or a number (in this case, nine) of taps 208 in a transformer winding 225 (also called a tap changer winding 225). Each of the taps 208 represents a connection point along the tap changer winding 225. In this way, the tap changer 206 allows a variable number of turns (corresponding to the taps 208) to be selected (using the selector TC) in discrete steps. As a result, a transformer with a variable turns ratio is produced, enabling stepped voltage regulation of the output. In certain example embodiments, the selector TC is positioned at a particular tap 208 by an example controller so that a particular voltage is output by the associated transformer.

Figure 3B:
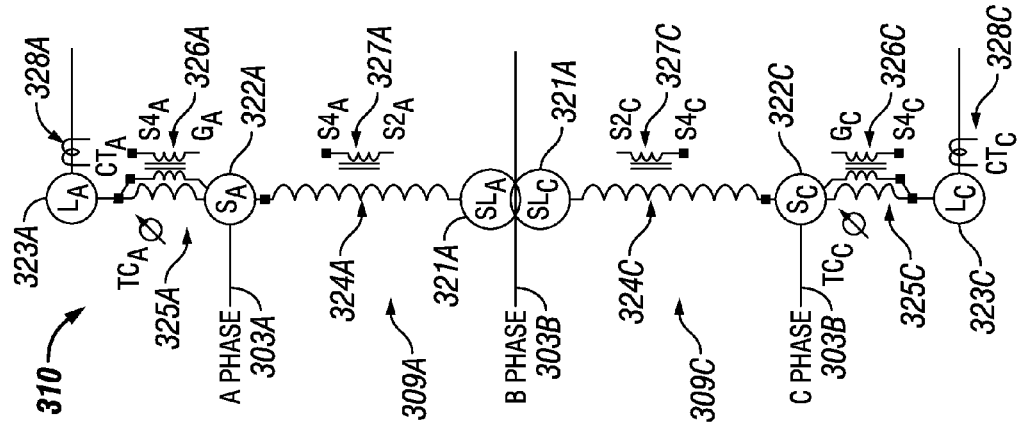
FIGS. 3A and 3B show a voltage regulation circuit for two regulated transformers in a multi-phase power system in accordance with certain example embodiments.
Figure 3A:
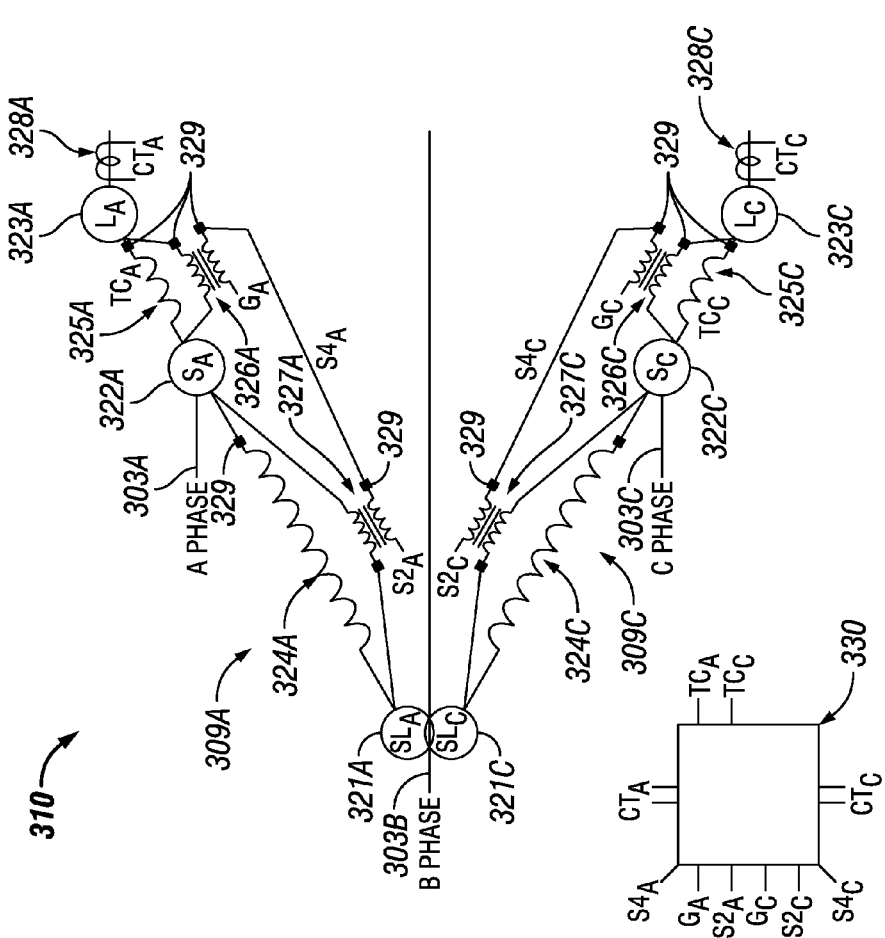

FIGS. 3A and 3B show a voltage regulation circuit 310 for two phase-to-phase voltages (sometimes referred to as regulated transformers in delta configurations) in a multi-phase power system in accordance with certain example embodiments. Specifically, FIG. 3A shows a schematic diagram of the voltage regulation circuit 310, including a controller 330, and FIG. 3B shows a varied configuration of the schematic diagram of the voltage regulation circuit 310 of FIG. 3A. The multi-phase power system in this case is an open delta configuration. In this configuration, two phase-to-phase voltages (in this case, A-B and C-B) are monitored and regulated, and the third phase-to-phase voltage (in this case, A-C) is not monitored in this example.

Regulated transformer 309A, which is connected to the A-B phase-to-phase power through secondary feeder lines 303A and 303B, includes a S terminal 322A, a L terminal 323A, and a SL terminal 321A. There is a standard primary transformer winding 324A (also called a shunt winding herein) disposed between and coupled to the S terminal 322A and the SL terminal 321A. There is also a tap changer winding 325A (also called a series winding herein) disposed between and coupled to the S terminal 322A and the L terminal 323A, where the series winding 325A includes multiple taps (not shown) and a selector $TC_A$ that selects one of the taps. The secondary feeder line 303A in this case is coupled to the S terminal 322A, and the secondary feeder line 303B in this case is coupled to the SL terminal 321A.

Regulated transformer 309C, which is connected to the C-B phase-to-phase power through secondary feeder lines 303C and 303B, includes a S terminal 322C, a L terminal 323C, and a SL terminal 321C. There is a shunt winding 324C disposed between and coupled to the S terminal 322C and the SL terminal 321C. There is also a series winding 325C disposed between and coupled to the S terminal 322C and the L terminal 323C, where the series winding 225C includes multiple taps (not shown) and a selector $TC_C$ that selects one of the taps. The secondary feeder line 303C in this case is coupled to the S terminal 322C, and the secondary feeder line 303B in this case is coupled to the SL terminal 321C.

The shunt winding 324A and the series winding 325A of transformer 309A can be configured the same as, or differently than, the shunt winding 324C and the series winding 325C of transformer 309C. In any case, the example controller 330 has all of the configuration information of regulated transformer 309A and regulated transformer 309C and uses such configuration information in regulating the voltage of the multi-phase power system.

The voltage regulation circuit 310 also includes a number of instrument transformers. For example, as shown in FIGS. 3A and 3B, the voltage regulation circuit 310 includes current transformer 328A (also called CT 328A) that measures current at the L terminal 323A, potential transformer 326A (also called PT 326A or series PT 326A) that measures the voltage across the series winding 325A (between the S terminal 322A and the L terminal 323A), and potential transformer 327A (also called PT 327A or shunt PT 327A) that measures the voltage across the shunt winding 324A (between the S terminal 322A and the SL terminal 321A).

Further, the voltage regulation circuit 310 of FIGS. 3A and 3B includes CT 328C that measures current at the L terminal 323C, PT 326C that measures the voltage across the series winding 325C (between the S terminal 322C and the L terminal 323C), and PT 327C that measures the voltage across the shunt winding 324C (between the S terminal 322C and the SL terminal 321C). The instrument transformers of the voltage regulation circuit 310 are coupled to the example controller 330. The potential transformers between a L terminal 323 and a S terminal 322 (in this case, PT 326A and PT 326C) of a voltage regulation circuit 310 can be referred to as internal differential potential transformers (IDPTs).

In this case, terminal $S2_A$ of the secondary winding of PT 327A and terminal $G_A$ of the secondary winding of PT 326A are coupled to controller 330. Further, the terminals of the secondary winding of CT 328A is also coupled to controller 330. Similarly, terminal $S2_C$ of the secondary winding of PT 327C and terminal $G_C$ of the secondary winding of PT 326C are coupled to controller 330. Further, the terminals of the secondary winding of CT 328C is also coupled to controller 330.

The positive polarity terminal 329 of the secondary of PT 326A is coupled to the positive polarity terminal 329 of the secondary of PT 327A to form terminal $S4_A$. Similarly, the positive polarity terminal 329 of the secondary of PT 326C is coupled to the positive polarity terminal 329 of the secondary of PT 327C to form terminal $S4_C$. In some cases, terminal $S4_A$ and/or terminal $S4_C$ can also be inputs to the controller 330. Further, in some cases, terminal $G_A$ and terminal $G_C$ can be electrically joined into a single terminal G that is a single input to the controller 330.

While the aforementioned terminals can be inputs to the controller 330, the controller 330 can also include one or more output channels. For example, in this case, the controller 330 can have output channel $TC_A$ and $TC_C$. Output channel $TC_A$ controls the selector $TC_A$ of the tap changer for the series winding 325A. Similarly, output channel $TC_C$ controls the selector $TC_C$ of the tap changer for the series winding 325C.

By using the example controller 330 for a multi-phase power system in an open delta configuration, voltages are measured (in the case of A-B phases and C-B phases) and calculated (in the case of A-C phases) between the two closed phase-to-phase measurements (in this case, A-B phases and C-B phases), which use center phase (in this case, B phase) as reference point. Example embodiments can be used to regulate phase-to-phase voltages in both forward and reverse power flow directions. Load current for the open phase (in this case, A-C phase) shall be calculated based upon the measured load current for the two connected phases (in this case, A-C phase and C-B phase).

FIGS. 3A and 3B show the voltage regulation circuit 310 when the power is flowing in the forward direction. When power flows in the reverse direction, the L terminals 323 virtually and temporarily become source terminals, and the S terminals 322 virtually and temporarily become load terminals. Since CT 328 is located at L terminal 323 for each phase, during reverse power flow, a correction for load current is needed (as with standard 4 wire Wye applications) due to the exciting current between location of CT 328 on L terminal 323 in reference to needed "Load" current on S terminal 322.

Using the controller 330 in example embodiments, during forward power flow, A-B phase-to-phase load volts measured between $L_A$ to $SL_A$ equals shunt and series windings and shunt and differential/series $PT_S$. In other words, the load voltage across PT 326A and PT 327A (with the positive polarity terminal 329 of each coupled to each other) equals the measured load voltage between $S2_A$ and $G_A$. Similarly, B-C phase-to-phase load volts $L_C$ to $SL_C$ equals shunt and series windings and shunt and differential/series $PT_S$. In other words, the load voltage across PT 326C and PT 327C (with the positive polarity terminal 329 of each coupled to each other) equals the measured load voltage between $S2_C$ and $G_C$. The C-A phase-to-phase load volts measured between $L_C$ and $L_A$ equals shunt and series windings and shunt and differential/series $PT_S$. In other words, the load voltage across series PT 326A and shunt PT 327A and shunt PT 327C and series PT 326C equals the load voltage between $L_C$ and $L_A$.

Further, using the controller 330 in example embodiments, during forward power flow, A-B phase-to-phase source volts measured between $S_A$ to $SL_A$ equals the shunt winding of A-B phase-to-phase, which in this case is the source voltage across shunt PT 326A measured between $S2_A$ and $G_A$. Similarly, B-C phase-to-phase source volts measured between Sc to $SL_C$ equals the shunt winding of B-C phase-to-phase, which in this case is the source voltage across shunt PT 326C measured between $S2_C$ and $G_C$. The C-A phase-to-phase source volts measured between $S_C$ and $S_A$ equals the shunt winding of C-A phase-to-phase. In other words, voltage across shunt PT 327A and shunt PT 327C equals the source voltage between $S_C$ and $S_A$.

During reverse power flow, A-B phase-to-phase load volts measured between $S_A$ to $SL_A$ equals the shunt winding of A-B phase-to-phase, as influenced by the series winding of A-B phase-to-phase, which in this case is the load voltage across shunt PT 326A measured between $S2_A$ and $G_A$. Similarly, B-C phase-to-phase load volts measured between Sc to $SL_C$ equals the shunt winding of B-C phase-to-phase, as influenced by the series winding of B-C phase-to-phase, which in this case is the load voltage across shunt PT 326C measured between $S2_C$ and $G_C$. The C-A phase-to-phase load volts measured between $S_C$ and $S_A$ equals the shunt winding of C-A phase-to-phase. In other words, voltage across shunt PT 327A and shunt PT 327C equals the load voltage between $S_C$ and $S_A$.

Further, using the controller 330 in example embodiments, during reverse power flow, A-B phase-to-phase source volts measured between $L_A$ to $SL_A$ equals shunt and series windings and shunt and differential/series $PT_S$. In other words, the source voltage across PT 326A and PT 327A (with the positive polarity terminal 329 of each coupled to each other) equals the measured load voltage between $S2_A$ and $G_A$. Similarly, B-C phase-to-phase source volts $L_C$ to $SL_C$ equals shunt and series windings and shunt and differential/series $PT_S$. In other words, the source voltage across PT 326C and PT 327C (with the positive polarity terminal 329 of each coupled to each other) equals the measured source voltage between $S2_C$ and $G_C$. The C-A phase-to-phase source volts measured between $L_C$ and $L_A$ equals shunt and series windings and shunt and differential/series $PT_S$. In other words, the source voltage across series PT 326A and shunt PT 327A and shunt PT 327C and series PT 326C equals the source voltage between $L_C$ and $L_A$.

The following three tables show how the example controller 330 of FIGS. 3A and 3B measures and calculates values (for both magnitude and phase angle), during both forward and reverse power flows, when 109.09 volts is applied to the S terminal 322A, the L terminal 323A, after adjustment of the selector $TC_A$ of the tap changer (series winding 325A), receives 120.00 volts.

| | | Polar Form | | | | Rectangular Form |
|---|---|---|---|---|---|---|
| | | Volts | Angle | | | |
| A (VR1) | L (VS) | 120.00 V | @ 0.00 | = | = | 120.00 + j0.00 |
| | DIFF | 10.91 V | @ 0.00 | = | = | 10.91 + j0.00 |
| | S (V7) | 109.09 V | @ 0.00 | = | = | 109.09 + j0.00 |
| C (VR2) | L (VS) | 120.00 V | @ −120.0° | = | = | −60.00 + −j103.92 |
| | DIFF | 10.91 V | @ −120.00 | = | = | −5.46 + −j9.45 |
| | S (V7) | 109.09 V | @ −120.0° | = | = | −54.55 + −j94.47 |

| Forward Power Flow | |
|---|---|
| Type A Source Volts | Type A Load Volts |
| A > B = ShuntA = $S_A$<br>109.09 + j0.00 | A > B = ShuntA + DiffA = $L_A$<br>120.00 + j0.00 |
| B > C = ShuntC = $S_C$<br>−54.55 + −j94.47 | B > C = ShuntC + DiffC = $L_C$<br>−60.00 + −j103.92 |
| C > A = ShuntA + ShuntC<br>54.44 + −j94.47 | C > A = ShuntA + DiffA +<br>ShuntC + DiffC<br>60.00 + −j103.92 |

| Reverse Power Flow | |
|---|---|
| Type A Source Volts | Type A Load Volts |
| A > B = ShuntA + DiffA = $L_A$<br>120.00 + j0.00 | A > B = ShuntA = $S_A$<br>109.09 + j0.00 |
| B > C = ShuntC + DiffC = $L_C$<br>−60.00 + −j103.92 | B > C = ShuntC = $S_C$<br>−54.55 + −j94.47 |
| C > A = ShuntA + DiffA +<br>ShuntC + DiffC<br>60.00 + −j103.92 | C > A = ShuntA + ShuntC<br>54.55 + −j94.47 |

| | | Rectangular Form | | | | Polar Form |
|---|---|---|---|---|---|---|
| A > B (VR2) | Fwd Srce | 109.09 + j0.00 | | = | = | 109.09 V @ 0.0° |
| | Fwd Load | 120.00 + j0.00 | | = | = | 120.00 V @ 0.0° |
| | Rev Srce | 120.00 + j0.00 | | = | = | 120.00 V @ 0.0° |
| | Rev Load | 109.09 + j0.00 | | = | = | 109.09 V @ 0.0° |
| B > C (VR3) | Fwd Srce | −54.55 + −j94.47 | | = | = | 109.09 V @ −120.0° |

-continued

| | | Rectangular Form | | | Polar Form |
|---|---|---|---|---|---|
| | Fwd Load | −60.00 + −j103.92 | = = | 120.00 V @ −120.0° |
| | Rev Srce | −60.00 + −j103.92 | = = | 120.00 V @ −120.0° |
| | Rev Load | −54.55 + −j94.47 | = = | 109.09 V @ −120.0° |
| C > A | Fwd Srce | 54.55 + −j94.47 | = = | 109.09 V @ 120.0° |
| | Fwd Load | 60.00 + −j103.92 | = = | 120.00 V @ 120.0° |
| | Rev Srce | 60.00 + −j103.92 | = = | 120.00 V @ 120.0° |
| | Rev Load | 54.55 + −j94.47 | = = | 109.09 V @ 120.0° |

The following three tables show how the example controller 330 of FIGS. 3A and 3B measures and calculates values (for both magnitude and phase angle), during both forward and reverse power flows, when 133.33 volts is applied to the S terminal 322A, the L terminal 323A, after adjustment of the selector $TC_A$ of the tap changer (series winding 325A), receives 120.00 volts.

| | | Polar Form | | | | |
|---|---|---|---|---|---|---|
| | | Volts | Angle | | | Rectangular Form |
| A | L (VS) | 120.00 V @ | 0.00 | = = | 120.00 + j0.00 |
| (VR1) | DIFF | −13.33 V @ | 0.00 | = = | −13.33 + j0.00 |
| | S (V7) | 133.33 V @ | 0.00 | = = | 133.33 + j0.00 |
| C | L (VS) | 120.00 V @ | −120.0° | = = | −60.00 + −j103.92 |
| (VR2) | DIFF | −13.33 V @ | −120.0° | = = | 6.67 + −j11.54 |
| | S (V7) | 133.33 V @ | −120.0° | = = | −66.67 + −j115.47 |

| Forward Power Flow | |
|---|---|
| Type A Source Volts | Type A Load Volts |
| A > B = ShuntA = $S_A$ 133.33 + j0.00 | A > B = ShuntA + DiffA = $L_A$ 120.00 + j0.00 |
| B > C = ShuntC = $S_C$ −66.67 + −j115.47 | B > C = ShuntC + DiffC = $L_C$ −60.00 + −j103.92 |
| C > A = ShuntA + ShuntC 66.67 + −j115.47 | C > A = ShuntA + DiffA + ShuntC + DiffC 60.00 + −j103.92 |

| Reverse Power Flow | |
|---|---|
| Type A Source Volts | Type A Load Volts |
| A > B = ShuntA + DiffA = $L_A$ 120.00 + j0.00 | A > B = ShuntA = $S_A$ 133.33 + j0.00 |
| B > C = ShuntC + DiffC = $L_C$ −60.00 + −j103.92 | B > C = ShuntC = $S_C$ −66.67 + −j115.47 |
| C > A = ShuntA + DiffA + ShuntC + DiffC 60.00 + −j103.92 | C > A = ShuntA + ShuntC 66.67 + −j115.47 |

| | | Rectangular Form | | | Polar Form |
|---|---|---|---|---|---|
| A > B | Fwd Srce | 133.33 + j0.00 | = = | 133.33 V @ 0.0° |
| (VR2) | Fwd Load | 120.00 + j0.00 | = = | 120.00 V @ 0.0° |
| | Rev Srce | 120.00 + j0.00 | = = | 120.00 V @ 0.0° |
| | Rev Load | 133.33 + j0.00 | = = | 133.33 V @ 0.0° |
| B > C (VR3) | Fwd Srce | −66.67 + −j115.47 | = = | 133.33 V @ −120.0° |
| | Fwd Load | −60.00 + −j103.92 | = = | 120.00 V @ −120.0° |
| | Rev Srce | −60.00 + −j103.92 | = = | 120.00 V @ −120.0° |
| | Rev Load | −66.67 + −j115.47 | = = | 133.33 V @ −120.0° |
| C > A | Fwd Srce | 66.67 + −j115.47 | = = | 133.33 V @ 120.0° |
| | Fwd Load | 60.00 + −j103.92 | = = | 120.00 V @ 120.0° |
| | Rev Srce | 60.00 + −j103.92 | = = | 120.00 V @ 120.0° |
| | Rev Load | 66.67 + −j115.47 | = = | 133.33 V @ 120.0° |

Figures 4A, 4B:
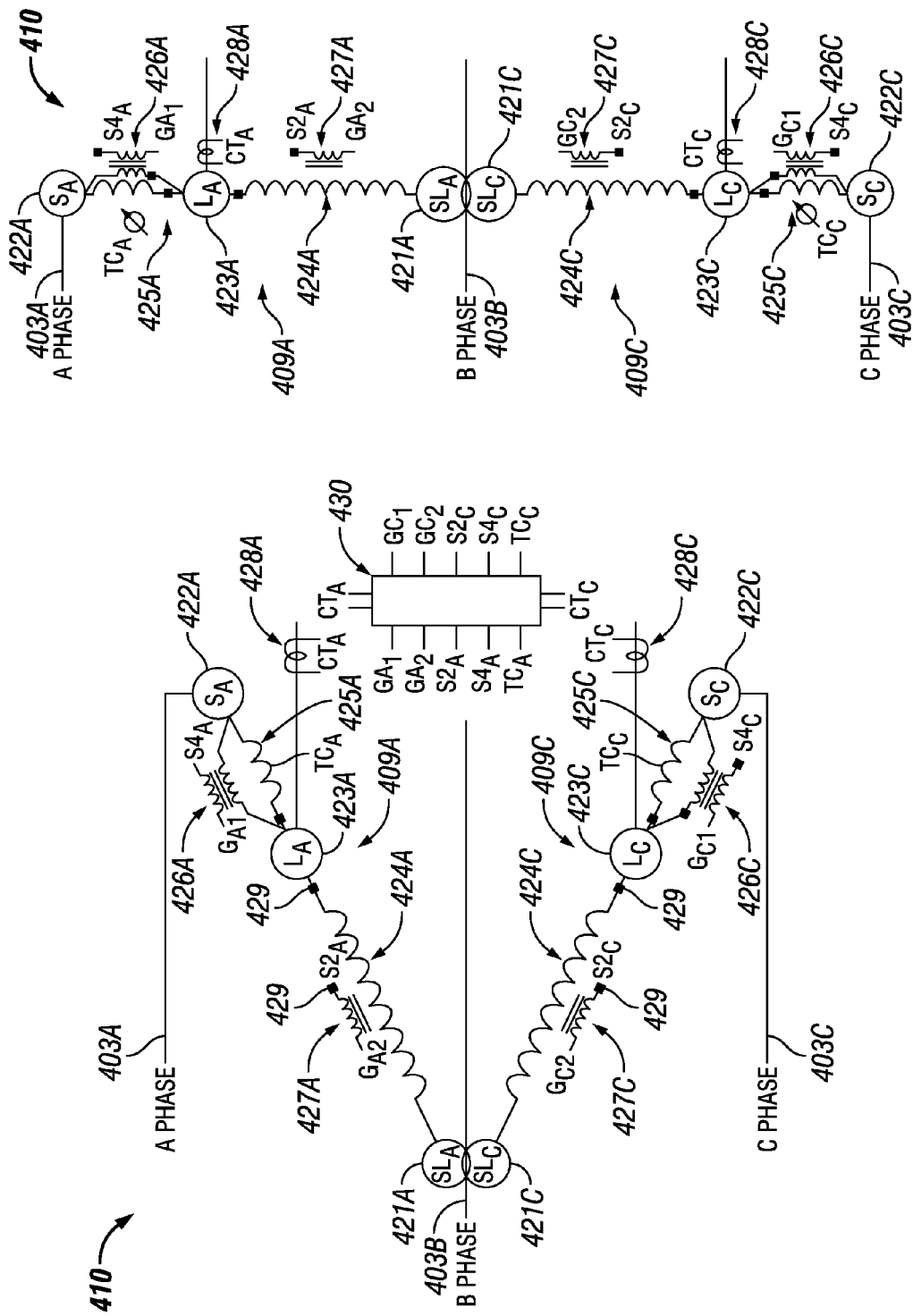
FIGS. 4A and 4B show another voltage regulation circuit for two regulated transformers in a multi-phase power system in accordance with certain example embodiments.

FIGS. 4A and 4B show another voltage regulation circuit 410 for two phases in a multi-phase power system in accordance with certain example embodiments. Specifically, FIG. 4A shows a schematic diagram of the voltage regulation circuit 410, including a controller 430, and FIG. 4B shows a varied configuration of the schematic diagram of the voltage regulation circuit 410 of FIG. 4A. Like the configuration of FIGS. 3A and 3B above, the multi-phase power system in this case is an open delta configuration.

The open delta configuration and corresponding voltage regulation circuit 410 of FIGS. 4A and 4B is substantially the same as the open delta configuration and corresponding voltage regulation circuit 310 of FIGS. 3A and 3B, except as described below. Specifically, rather than the S terminal 422 disposed between the L terminal 423 and the SL terminal 421 for each phase, as was the case in FIGS. 3A and 3B above, the L terminal 423 is disposed between the S terminal 422 and the SL terminal 421 for each phase.

Further, there is no direct electrical connection between the secondary of PT 426 and the secondary of PT 427 for any phase of power in FIGS. 4A and 4B. Instead, the secondary of PT 426 has terminal S4 and terminal G. For example, PT 426A of A phase has terminal $S4_A$ and terminal $G_{A1}$. Similarly, the secondary of PT 427 has terminal S2 and terminal G. For example, PT 427A of A phase has terminal $S2_A$ and terminal $G_{A2}$. In some cases, terminal $G_{A1}$ of PT 426 and terminal $G_{A2}$ of PT 427 can be electrically coupled to each other, creating a common terminal $G_A$. Further, one or more G terminals of one regulated transformer can be electrically combined with one or more G terminals of one or more other regulated transformers. In this way, there can be four different terminal G inputs to the controller 430, a single G input to the controller 430, or any number (e.g., two, three) therebetween of terminal G inputs to the controller 430.

As a result, inputs to the controller 430 in this case can include both terminals of $CT_A$, both terminals of $CT_C$, terminal $S4_A$ and terminal $G_{A1}$ of PT 426A, terminal $S4_C$ and terminal $G_{C1}$ of PT 426C, terminal $S2_A$ and terminal $G_{A2}$ of PT 427A, and terminal $S2_C$ and terminal $G_{C2}$ of PT 427C. The controller 430 continues to have output channel $TC_A$ and $TC_C$ to control the tap changers TC of the respective series windings 425.

Using the controller 430 in example embodiments, during forward power flow, A-B phase-to-phase load volts measured from $L_A$ to $SL_A$ equals the shunt/control windings of regulated transformer A 409A. In other words, the load voltage across PT 427A equals the measured load voltage between $S2_A$ and $G_{A2}$. Similarly, B-C phase-to-phase load volts $L_C$ to $SL_C$ equals the shunt/control windings of regulated transformer C 409C. In other words, the load voltage across PT 427C equals the measured load voltage between $S2_C$ and $G_{C2}$. The C-A phase-to-phase load volts measured between $L_C$ and $L_A$ equals the shunt/control windings of regulated transformer A 409A and the shunt/control windings of regulated transformer C 409C. In other words, the load voltage across shunt PT 427A and shunt PT 427C equals sum of the measured load voltage between $S2_A$ and $G_{A2}$ and the measured load voltage between $S2_C$ and $G_{C2}$.

Further, using the controller 430 in example embodiments, during forward power flow, A-B phase-to-phase source volts measured between $S_A$ to $SL_A$ equals the shunt/control and series winding of regulated transformer A 409A, which in this case is the sum of the source voltage across control PT 427A (measured between $S2_A$ and $G_{A2}$) and differential PT 426A (measured between $S4_A$ and $G_{A1}$). Similarly, B-C phase-to-phase source volts measured between $S_C$ to $SL_C$ equals the shunt/control and series winding of regulated transformer C 409C, which in this case is the sum of the source voltage across control PT 427C (measured between $S2_C$ and $G_{C2}$) and differential PT 426C (measured between $S4_C$ and $G_{C1}$). The C-A phase-to-phase source volts measured between $S_C$ and $S_A$ equals the shunt/control and series winding of regulated transformer A 409A and the shunt/control and series winding of regulated transformer C 409C. In other words, voltage across differential PT 426A, control PT 427A, control PT 427C, and differential PT 426C equals the source voltage between $S_C$ and $S_A$.

During reverse power flow, A-B phase-to-phase load volts measured between $S_A$ to $SL_A$ equals the shunt/control and series winding of regulated transformer A 409A, which in this case is the sum of the load voltage across control PT 427A (measured between $S2_A$ and $G_{A2}$) and differential PT 426A (measured between $S4_A$ and $G_{A1}$). Similarly, B-C phase-to-phase load volts measured between $S_C$ to $SL_C$ equals the shunt/control and series winding of regulated transformer C 409C, which in this case is the sum of the load voltage across control PT 427C (measured between $S2_C$ and $G_{C2}$) and differential PT 426C (measured between $S4_C$ and $G_{C1}$). The C-A phase-to-phase load volts measured between $S_C$ and $S_A$ equals the shunt/control and series winding of regulated transformer A 409A and the shunt/control and series winding of regulated transformer C 409C. In other words, voltage across differential PT 426A, control PT 427A, control PT 427C, and differential PT 426C equals the load voltage between $S_C$ and $S_A$.

Further, using the controller 330 in example embodiments, during reverse power flow, A-B phase-to-phase source volts measured between $L_A$ to $SL_A$ equals the shunt/control windings of regulated transformer A 409A. In other words, the source voltage across PT 427A equals the measured source voltage between $S2_A$ and $G_{A2}$. Similarly, B-C phase-to-phase source volts $L_C$ to $SL_C$ equals the shunt/control windings of regulated transformer C 409C. In other words, the source voltage across PT 427C equals the measured source voltage between $S2_C$ and $G_{C2}$. The C-A phase-to-phase load volts measured between $L_C$ and $L_A$ equals the shunt/control windings of regulated transformer A 409A and the shunt/control windings of regulated transformer C 409C. In other words, the source voltage across shunt PT 427A and shunt PT 427C equals sum of the measured load voltage between $S2_A$ and $G_{A2}$ and the measured source voltage between $S2_C$ and $G_{C2}$.

The following three tables show how the example controller 430 of FIGS. 4A and 4B measures and calculates values (for both magnitude and phase angle), during both forward and reverse power flows, when 109.09 volts is applied to the S terminal 422A, the L terminal 423A, after adjustment of the selector $TC_A$ of the tap changer (series winding 425A), receives 120.00 volts.

| | | Polar Form | | | | Rectangular Form | |
|---|---|---|---|---|---|---|---|
| | | Volts | Angle | | | | |
| A | L (VS) | 120.00 V | @ 0.00 | = | = | 120.00 + | j0.00 |
| (VR1) | DIFF | 10.91 V | @ 0.00 | = | = | 10.91 + | j0.00 |
| | S (V7) | 109.09 V | @ 0.00 | = | = | 109.09 + | j0.00 |
| C | L (VS) | 120.00 V | @ −120.0° | = | = | −60.00 + | −j103.92 |
| (VR2) | DIFF | 10.91 V | @ −120.0° | = | = | −5.46 + | −j9.45 |
| | S (V7) | 109.09 V | @ −120.0° | = | = | −54.55 + | −j94.47 |

| Forward Power Flow | |
|---|---|
| Type A Source Volts | Type A Load Volts |
| A > B = ShuntA + DiffA = $S_A$<br>109.09 + j0.00 | A > B = ShuntA = $L_A$<br>120.00 + j0.00 |
| B > C = ShuntC + DiffC = $S_C$<br>−54.55 + −j94.47 | B > C = ShuntC = $L_C$<br>−60.00 + −j103.92 |
| C > A = ShuntA + DiffA +<br>ShuntC + DiffC<br>54.44 + −j94.47 | C > A = ShuntA + ShuntC<br>60.00 + −j103.92 |

| Reverse Power Flow | |
|---|---|
| Type A Source Volts | Type A Load Volts |
| A > B = ShuntA = $L_A$<br>120.00 + j0.00 | A > B = ShuntA + DiffA = $S_A$<br>109.09 + j0.00 |
| B > C = ShuntC = $L_C$<br>−60.00 + −j103.92 | B > C = ShuntC + DiffC = $L_C$<br>−54.55 + −j94.47 |
| C > A = ShuntA + ShuntC<br>60.00 + −j103.92 | C > A = ShuntA + DiffA +<br>ShuntC + DiffC<br>54.55 + −j94.47 |

| | | Rectangular Form | | | | Polar Form | |
|---|---|---|---|---|---|---|---|
| A > B<br>(VR2) | Fwd Srce | 109.09 + | j0.00 | = | = | 109.09 V | @ 0.0° |
| | Fwd Load | 120.00 + | j0.00 | = | = | 120.00 V | @ 0.0° |
| | Rev Srce | 120.00 + | j0.00 | = | = | 120.00 V | @ 0.0° |
| | Rev Load | 109.09 + | j0.00 | = | = | 109.09 V | @ 0.0° |
| B > C<br>(VR3) | Fwd Srce | −54.55 + | −j94.47 | = | = | 109.09 V | @ −120.0° |
| | Fwd Load | −60.00 + | −j103.92 | = | = | 120.00 V | @ −120.0° |
| | Rev Srce | −60.00 + | −j103.92 | = | = | 120.00 V | @ −120.0° |
| | Rev Load | −54.55 + | −j94.47 | = | = | 109.09 V | @ −120.0° |
| C > A | Fwd Srce | 54.55 + | −j94.47 | = | = | 109.09 V | @ 120.0° |
| | Fwd Load | 60.00 + | −j103.92 | = | = | 120.00 V | @ 120.0° |
| | Rev Srce | 60.00 + | −j103.92 | = | = | 120.00 V | @ 120.0° |
| | Rev Load | 54.55 + | −j94.47 | = | = | 109.09 V | @ 120.0° |

The following three tables show how the example controller 430 of FIGS. 4A and 4B measures and calculates values (for both magnitude and phase angle), during both forward and reverse power flows, when 133.33 volts is applied to the S terminal 422A, the L terminal 423A, after adjustment of the selector $TC_A$ of the tap changer (series winding 425A), receives 120.00 volts.

| | | Polar Form | | | | Rectangular Form |
|---|---|---|---|---|---|---|
| | | Volts | Angle | | | |
| A (VR1) | L (VS) | 120.00 V | @ 0.0° | = = | | 120.00 + j0.00 |
| | DIFF | −10.90 V | @ 0.0° | = = | | −10.90 + j0.00 |
| | S (V7) | 130.90 V | @ 0.0° | = = | | 130.90 + j0.00 |
| C (VR2) | L (VS) | 120.00 V | @ −120.0° | = = | | −60.00 + −j103.92 |
| | DIFF | −10.90 V | @ −120.0° | = = | | −5.45 + −j9.44 |
| | S (V7) | 130.90 V | @ −120.0° | = = | | −65.45 + −j113.36 |

| Forward Power Flow | |
|---|---|
| Type A Source Volts | Type A Load Volts |
| A > B = ShuntA + DiffA = $S_A$ <br> 130.90 + j0.00 | A > B = ShuntA = $L_A$ <br> 120.00 + j0.00 |
| B > C = ShuntC + DiffC = $S_C$ <br> −65.45 + −j113.36 | B > C = ShuntC = $L_C$ <br> −60.00 + −j103.92 |
| C > A = ShuntA + DiffA + ShuntC + DiffC <br> 65.45 + −j113.36 | C > A = ShuntA + ShuntC <br> 60.00 + −j103.92 |

| Reverse Power Flow | |
|---|---|
| Type A Source Volts | Type A Load Volts |
| A > B = ShuntA = $L_A$ <br> 120.00 + j0.00 | A > B = ShuntA + DiffA = $S_A$ <br> 130.90 + j0.00 |
| B > C = ShuntC = $L_C$ <br> −60.00 + −j103.92 | B > C = ShuntC + DiffC = $S_C$ <br> −65.45 + −j113.36 |
| C > A = ShuntA + ShuntC <br> 60.00 + −j103.92 | C > A = ShuntA + DiffA + ShuntC + DiffC <br> 65.45 + −j113.36 |

| | | Rectangular Form | | | Polar Form | |
|---|---|---|---|---|---|---|
| A > B | Fwd Srce | 130.90 + j0.00 | = = | 130.90 V | @ | 0.0° |
| (VR2) | Fwd Load | 120.00 + j0.00 | = = | 120.00 V | @ | 0.0° |
| | Rev Srce | 120.00 + j0.00 | = = | 120.00 V | @ | 0.0° |
| | Rev Load | 130.90 + j0.00 | = = | 130.90 V | @ | 0.0° |
| B > C | Fwd Srce | −65.45 + −j113.36 | = = | 130.90 V | @ | −120.0° |
| (VR3) | Fwd Load | −60.00 + −j103.92 | = = | 120.00 V | @ | −120.0° |
| | Rev Srce | −60.00 + −j103.92 | = = | 120.00 V | @ | −120.0° |
| | Rev Load | −65.45 + −j113.36 | = = | 130.90 V | @ | −120.0° |
| C > A | Fwd Srce | 65.45 + −j113.36 | = = | 130.90 V | @ | 120.0° |
| | Fwd Load | 60.00 + −j103.92 | = = | 120.00 V | @ | 120.0° |
| | Rev Srce | 60.00 + −j103.92 | = = | 120.00 V | @ | 120.0° |
| | Rev Load | 65.45 + −j113.36 | = = | 130.90 V | @ | 120.0° |

Figure 5A:
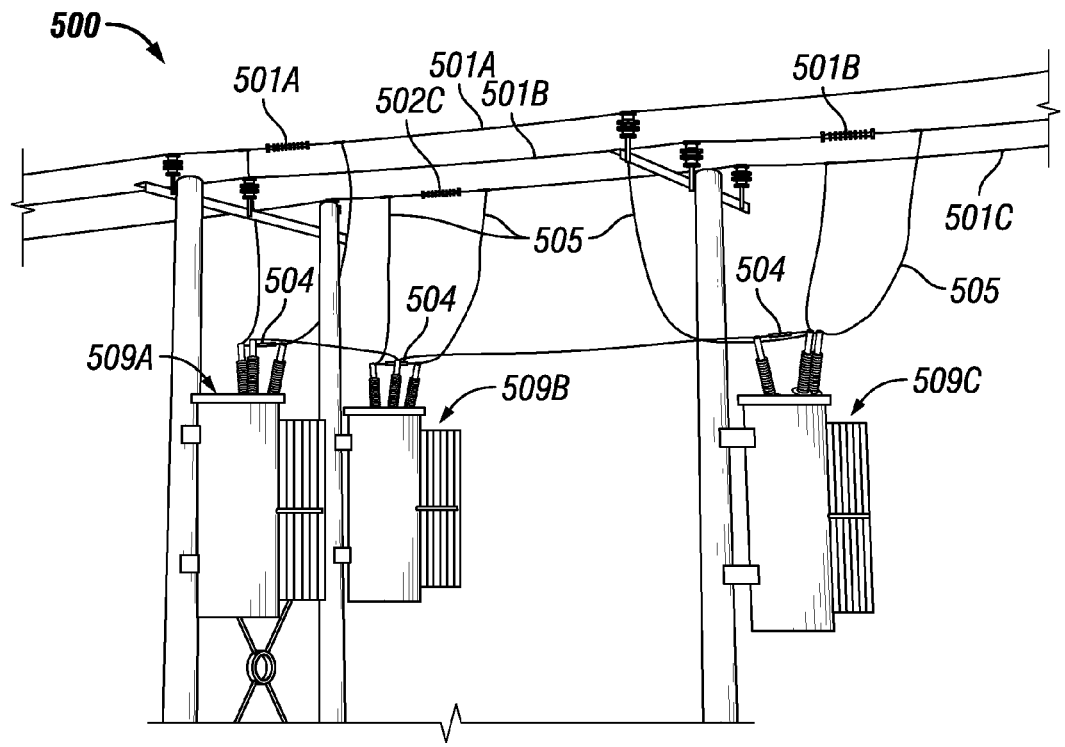
FIGS. 5A and 5B show a three phase power system in which all three regulated transformers are regulated in accordance with certain example embodiments.
Figure 5B:
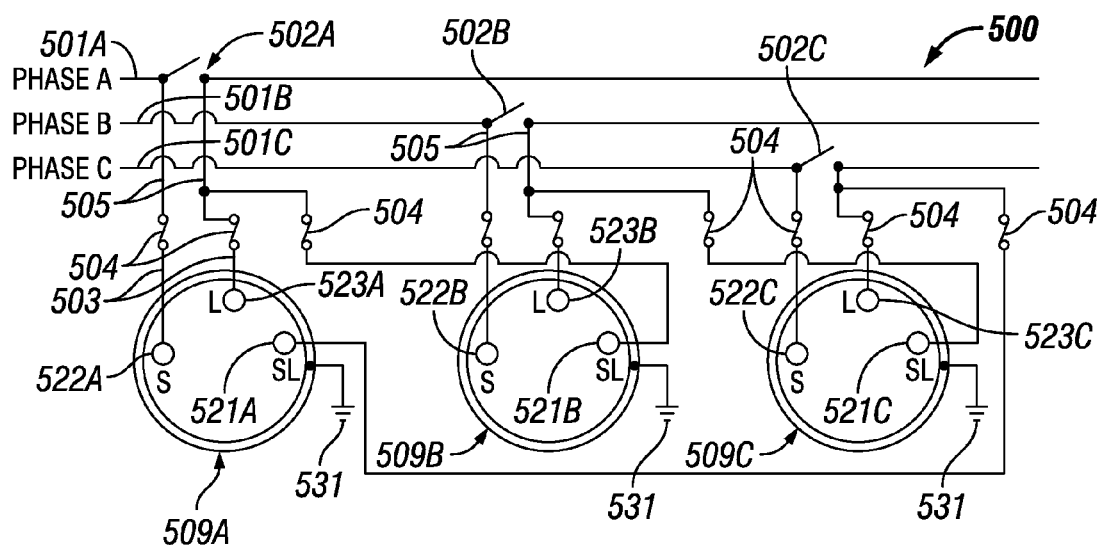

FIGS. 5A and 5B show a three phase power system 500 in which all three regulated transformers 509 are regulated in accordance with certain example embodiments. Specifically, FIG. 5A shows a bottom perspective view of the system 500, and FIG. 5B shows a schematic diagram of the system 500. The system 500 of FIGS. 5A and 5B is substantially the same as the system 100 of FIGS. 1A and 1B, except that there are three regulated transformers 509. In other words, there is a regulated transformer 509A for A-B phase-to-phase, a regulated transformer 509B for B-C phase-to-phase, and a regulated transformer 509C for C-A phase-to-phase.

Figure 6A:
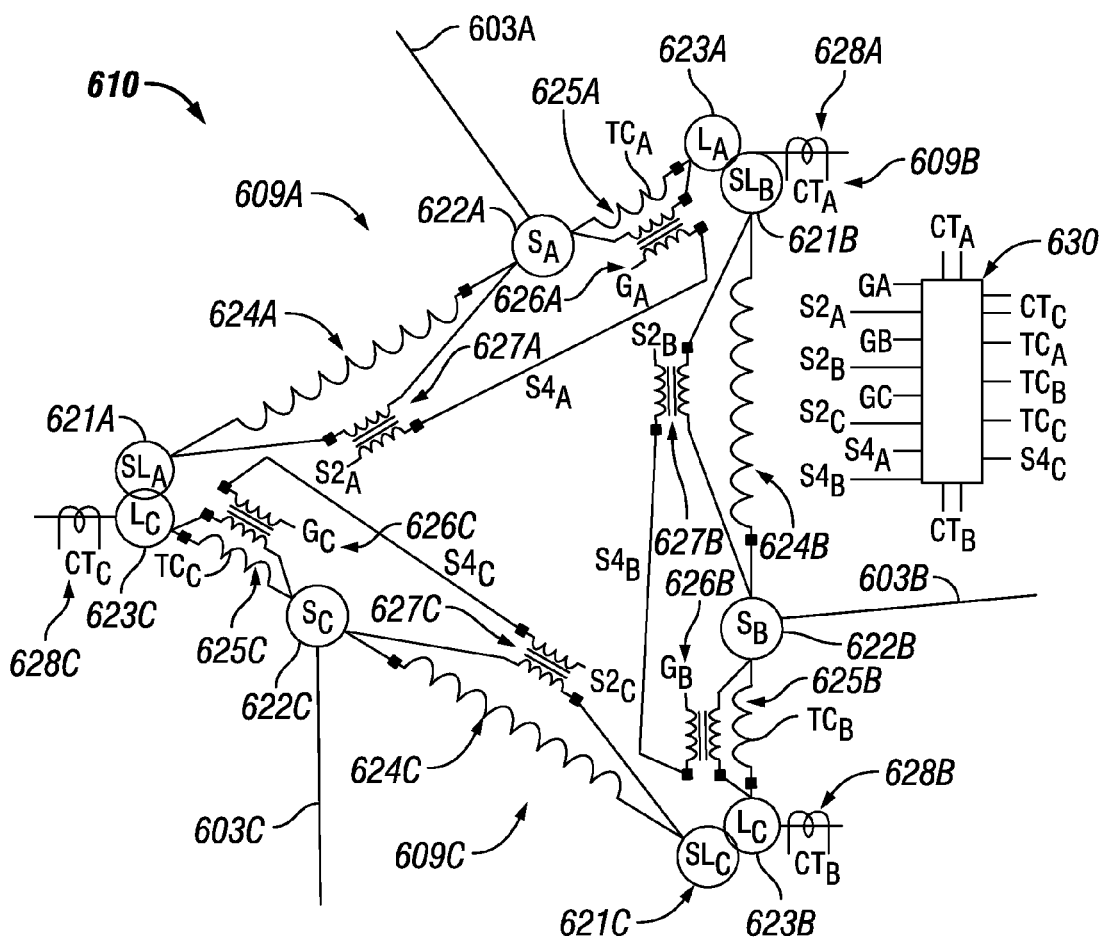
FIGS. 6A and 6B show a voltage regulation circuit for three regulated transformers in a multi-phase power system in accordance with certain example embodiments.
Figure 6B:
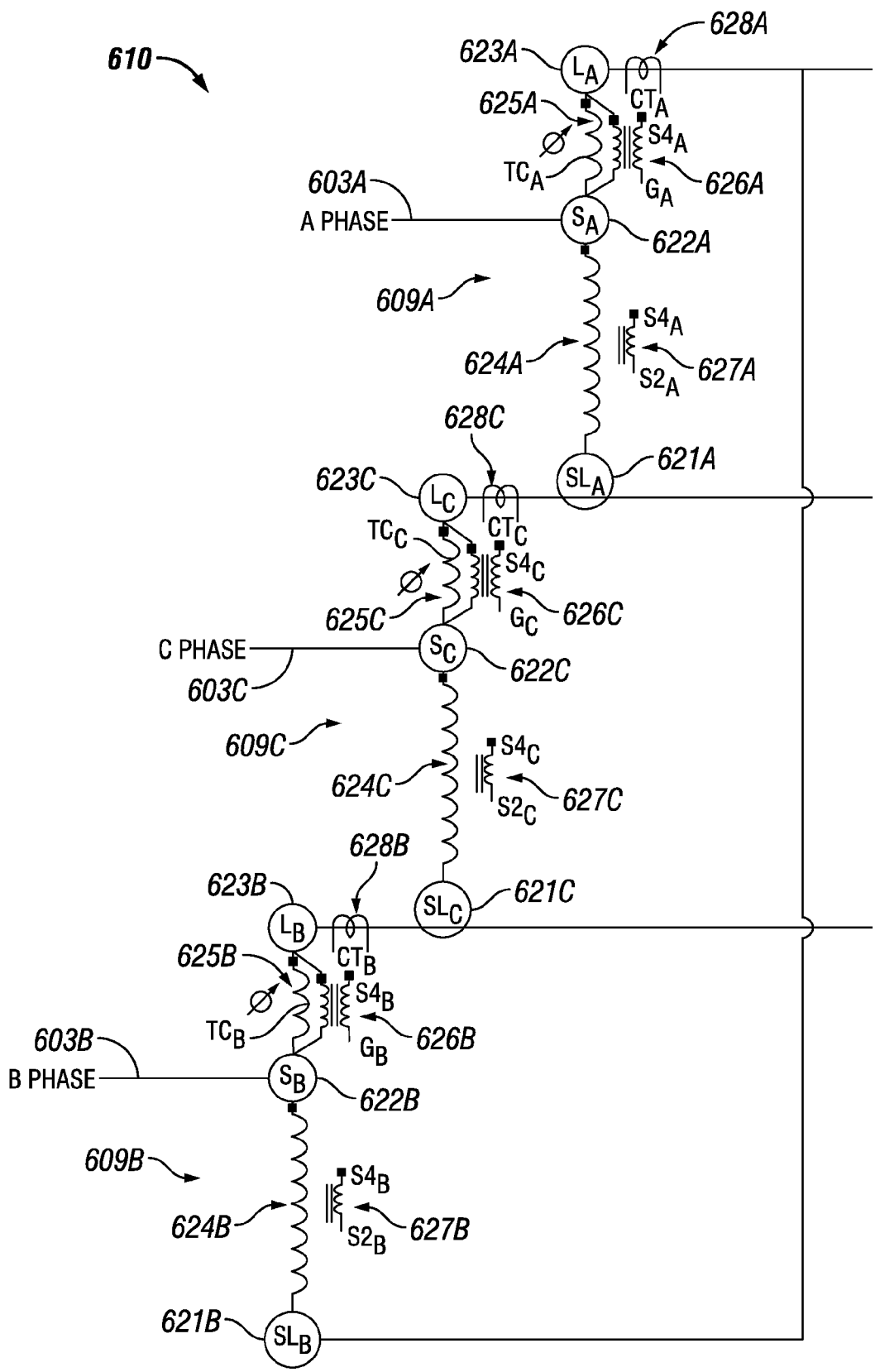

FIGS. 6A and 6B show a voltage regulation circuit 610 for three phases in a multi-phase power system in accordance with certain example embodiments. Specifically, FIG. 6A shows a schematic diagram of the voltage regulation circuit 610, including a controller 630, and FIG. 6B shows a varied configuration of the schematic diagram of the voltage regulation circuit 610 of FIG. 6A. The multi-phase power system in this case is a closed delta configuration. In this configuration, all three phases (in this case, A-B phase-to-phase, B-C phase-to-phase, and C-A phase-to-phase) are monitored and regulated.

The regulated transformers 609 of FIGS. 6A and 6B are configured substantially the same as the regulated transformers 309 of FIGS. 3A and 3B above. Further, the instrument transformers (in this case, CT 628, PT 626, and PT 627) of FIGS. 6A and 6B are configured substantially the same as the instrument transformers (in this case, CT 328, PT 326, and PT 327) of FIGS. 3A and 3B. In addition, the controller 630 of FIGS. 6A and 6B is configured substantially the same as the controller 330 of FIGS. 3A and 3B, except that the controller 630 includes additional input channels for both terminals of $CT_B$, terminal $G_A$ of PT 626A, and terminal $S2_B$ of PT 627A, and an additional output channel for $TC_B$.

In some cases, terminal $S4_A$, terminal $S4_B$, and/or terminal $S4_C$ can also be inputs to the controller 430. Further, in some cases, terminal $G_A$, terminal $G_B$, and terminal $G_C$ can be electrically joined into a single terminal G that is a single input to the controller 430. If only two of the three terminal Gs are combined, then the controller 430 has two terminal G inputs.

By using the example controller 630 for a multi-phase power system in a closed delta configuration, voltages associated with the S terminal of one regulated transformer 609 (e.g., S terminal 622A of regulated transformer 609A) to the S terminal of another regulated transformer (e.g., S terminal 622B of regulated transformer 609B) can be measured and/or calculated to allow for proper voltage regulation in forward and/or reverse power flow mode. Phase-to-phase voltage measurements of S terminals 622 can be performed using a voltage across a series differential PT 626 from one regulated transformer 609 (e.g., PT 626A of regulated transformer 609A) and the voltage across a shunt PT 627 (e.g., PT 627B of regulated transformer 609B) from the other regulated transformer 609B. Thus, as discussed below, phase A to phase B (terminal $S_A$ 622A to terminal $S_B$ 622B) voltage becomes the combination of shunt PT 627B (measured between $S2_B$ to $S4_B$) and differential PT 626A (also called calculated differential PT 626A) (measured between $S4_A$ to $G_A$).

Using the controller 630 in example embodiments, during forward power flow, A-B phase-to-phase load volts measured between $L_A$ to $L_B$ equals the shunt winding 624B and series winding 625B of regulated transformer 609B, which is the measured load voltage between $S2_B$ and $G_B$ (with the positive polarity of PT 426B and the positive polarity of PT 427B being electrically coupled to each other at $S4_B$). Similarly, B-C phase-to-phase load volts $L_B$ to $L_C$ equals the shunt winding 624C and series winding 625C of regulated transformer 609C, which is the measured load voltage between $S2_C$ and $G_C$ (with the positive polarity of PT 426C and the positive polarity of PT 427C being electrically coupled to each other at $S4_C$). The C-A phase-to-phase load volts measured between $L_C$ and $L_A$ equals the shunt winding 624A and series winding 625A of regulated transformer 609A, which is the measured load voltage between $S2_A$ and $G_A$ (with the positive polarity of PT 426A and the positive polarity of PT 427A being electrically coupled to each other at $S4_A$).

Further, using the controller 630 in example embodiments, during forward power flow, A-B phase-to-phase source volts measured between $S_A$ to $S_B$ equals the shunt winding 624B of regulated transformer 609B and the series winding 625A of regulated transformer 609A, which in this case is the sum of the source voltage across shunt PT 627B (measured between S2$_B$ and S4$_B$) and differential PT 626A (measured between S4$_A$ and G$_A$). Similarly, B-C phase-to-phase source volts measured between S$_B$ to S$_C$ equals the shunt winding 624C of regulated transformer C and the series winding 625B of regulated transformer B, which in this case is the sum of the source voltage across shunt PT 627C (measured between S2$_C$ and S4$_C$) and differential PT 626B (measured between S4$_B$ and G$_B$). The C-A phase-to-phase source volts measured between S$_C$ and S$_A$ equals the shunt winding 624A of regulated transformer A and the series winding 625C of regulated transformer C, which in this case is the sum of the source voltage across shunt PT 627A (measured between S2$_A$ and S4$_A$) and differential PT 626C (measured between S4c and G$_C$).

During reverse power flow, A-B phase-to-phase load volts measured between S$_A$ to S$_B$ equals the shunt winding 624B of regulated transformer B and the series winding 625A of regulated transformer A, which in this case is the sum of the load voltage across shunt PT 627B (measured between S2$_B$ and S4$_B$) and differential PT 626A (measured between S4$_A$ and G$_A$). Similarly, B-C phase-to-phase load volts measured between S$_B$ to S$_C$ equals the shunt winding 624A of regulated transformer C and the series winding 625B of regulated transformer B, which in this case is the sum of the load voltage across shunt PT 627C (measured between S2$_C$ and S4$_C$) and differential PT 626B (measured between S4$_B$ and G$_B$). The C-A phase-to-phase load volts measured between S$_C$ and S$_A$ equals the shunt winding 624A of regulated transformer A and the series winding 625C of regulated transformer C, which in this case is the sum of the load voltage across shunt PT 627A (measured between S2$_A$ and S4$_A$) and differential PT 626C (measured between S4$_C$ and G$_C$). For the proper voltage regulation of load voltage in the reverse power direction, the series winding 625 of any included additional voltage regulator should be included in any measurements and/or calculations.

Further, using the controller 630 in example embodiments, during reverse power flow, A-B phase-to-phase source volts measured between L$_A$ to L$_B$ equals the shunt winding 624B and the series winding 625B of regulated transformer B, which is the measured source voltage between S2$_B$ and G$_B$ (with the positive polarity of PT 426B and the positive polarity of PT 427B being electrically coupled to each other at S4$_B$). Similarly, B-C phase-to-phase source volts L$_B$ to L$_C$ equals the shunt winding 624C and the series winding 625C of regulated transformer C, which is the measured source voltage between S2$_C$ and G$_C$ (with the positive polarity of PT 426C and the positive polarity of PT 427C being electrically coupled to each other at S4$_C$). The C-A phase-to-phase source volts measured between L$_C$ and L$_A$ equals the shunt winding 624A and the series winding 625A of regulated transformer A, which is the measured source voltage between S2$_A$ and G$_A$ (with the positive polarity of PT 426A and the positive polarity of PT 427A being electrically coupled to each other at S4$_A$).

The following three tables show how the example controller 630 of FIGS. 6A and 6B measures and calculates values (for both magnitude and phase angle), during both forward and reverse power flows, when 109.09 volts is applied to the S terminal 622A, the L terminal 623A, after adjustment of the selector TC$_A$ of the tap changer (series winding 425A), receives 120.00 volts.

| | | Polar Form | | | Rectangular Form |
|---|---|---|---|---|---|
| | | Volts | Angle | | |
| A (VR1) | L (VS) | 120.00 V @ | 0.0° | = = | 120.00 + j0.00 |
| | DIFF | 10.91 V @ | 0.0° | = = | 10.91 + j0.00 |
| | S (V7) | 109.09 V @ | 0.0° | = = | 109.09 + j0.00 |
| B (VR2) | L (VS) | 120.00 V @ | −120.0° | = = | −60.00 + −j103.92 |
| | DIFF | 10.91 V @ | −120.0° | = = | −5.46 + −j9.45 |
| | S (V7) | 109.09 V @ | −120.0° | = = | −54.55 + −j94.47 |
| C (VR2) | L (VS) | 120.00 V @ | 120.0° | = = | −60.00 + j103.92 |
| | DIFF | 10.91 V @ | 120.0° | = = | −5.46 + j9.45 |
| | S (V7) | 109.09 V @ | 120.0° | = = | −54.55 + j94.47 |

| Forward Power Flow | |
|---|---|
| Type A Source Volts | Type A Load Volts |
| A > B = ShuntB + DiffA<br>−43.64 + −j94.47 | A > B = ShuntB + DiffB = L$_B$<br>−60.00 + −j103.92 |
| B > C = ShuntC + DiffB<br>−60.00 + j85.03 | B > C = ShuntC + DiffC = L$_C$<br>−60.00 + −j103.92 |
| C > A = ShuntA + DiffC<br>103.64 + j9.45 | C > A = ShuntA + DiffA = L$_A$<br>120.00 + j0.00 |

| Reverse Power Flow | |
|---|---|
| Type A Source Volts | Type A Load Volts |
| A > B = ShuntB + DiffB = L$_B$<br>−60.00 + −j103.92 | A > B = ShuntB + DiffA<br>−43.64 + −j94.47 |
| B > C = ShuntC + DiffC = L$_C$<br>−60.00 + j103.92 | B > C = ShuntC + DiffB<br>−60.00 + −j85.03 |
| C > A = ShuntA + DiffA = L$_A$<br>120.00 + j0.00 | C > A = ShuntA + DiffC<br>103.64 + j9.45 |

| | | Rectangular Form | | Polar Form |
|---|---|---|---|---|
| A > B | Fwd Srce | −43.64 + −j94.47 | = = | 104.06 V @ −114.8° |
| (VR2) | Fwd Load | −60.00 + −j103.92 | = = | 120.00 V @ −120.0° |
| | Rev Srce | −60.00 + −j103.92 | = = | 120.00 V @ −120.0° |
| | Rev Load | −43.64 + −j94.47 | = = | 104.06 V @ −114.8° |
| B > C | Fwd Srce | −60.00 + j85.03 | = = | 104.06 V @ 125.2° |
| (VR3) | Fwd Load | −60.00 + j103.92 | = = | 120.00 V @ 120.0° |
| | Rev Srce | −60.00 + j103.92 | = = | 120.00 V @ 120.0° |
| | Rev Load | −60.00 + j85.03 | = = | 104.06 V @ 125.2° |
| C > A | Fwd Srce | 103.64 + j9.45 | = = | 104.06 V @ 5.2° |
| (VR1) | Fwd Load | 120.00 + j0.00 | = = | 120.00 V @ 0.0° |
| | Rev Srce | 120.00 + j0.00 | = = | 120.00 V @ 0.0° |
| | Rev Load | 103.64 + j9.45 | = = | 104.06 V @ 5.2° |

The following three tables show how the example controller 630 of FIGS. 6A and 6B measures and calculates values (for both magnitude and phase angle), during both forward and reverse power flows, when 133.33 volts is applied to the S terminal 622A, the L terminal 623A, after adjustment of the selector TC$_A$ of the tap changer (series winding 425A), receives 120.00 volts.

| | | Polar Form | | | Rectangular Form |
|---|---|---|---|---|---|
| | | Volts | Angle | | |
| A (VR1) | L (VS) | 120.00 V @ | 0.0° | = = | 120.00 + j0.00 |
| | DIFF | −13.33 V @ | 0.0° | = = | −13.33 + j0.00 |
| | S (V7) | 133.33 V @ | 0.0° | = = | 133.33 + j0.00 |
| B (VR2) | L (VS) | 120.00 V @ | −120.0° | = = | −60.00 + −j103.92 |
| | DIFF | −13.33 V @ | −120.0° | = = | 6.67 + j11.54 |
| | S (V7) | 133.33 V @ | −120.0° | = = | −66.67 + −j115.47 |

-continued

| Polar Form | | | | |
|---|---|---|---|---|
| | | Volts | Angle | Rectangular Form |
| C (VR3) | L (VS) | 120.00 V @ | 120.0° == | −60.00 + j103.92 |
| | DIFF | −13.33 V @ | 120.0° == | 6.67 + −j11.54 |
| | S (V7) | 133.33 V @ | 120.0° == | −66.67 + j115.47 |

| Forward Power Flow | |
|---|---|
| Type A Source Volts | Type A Load Volts |
| A > B = ShuntB + DiffA<br>−80.00 + j115.47<br>B > C = ShuntC + DiffB<br>−60.00 + j127.01<br>C > A = ShuntA + DiffC<br>140.00 + −j11.54 | A > B = ShuntB + DiffB = $L_B$<br>−60.00 + −j103.92<br>B > C = ShuntC + DiffC = $L_C$<br>−60.00 + −j103.92<br>C > A = ShuntA + DiffA = $L_A$<br>120.00 + j0.00 |

| Reverse Power Flow | |
|---|---|
| Type A Source Volts | Type A Load Volts |
| A > B = ShuntB + DiffB = $L_B$<br>−60.00 + j103.92<br>B > C = ShuntC + DiffC = $L_C$<br>−60.00 + j103.92<br>C > A = ShuntA + DiffA = $L_A$<br>120.00 + j0.00 | A > B = ShuntB + DiffA<br>−80.00 + j115.47<br>B > C = ShuntC + DiffB<br>−60.00 + j127.01<br>C > A = ShuntA + DiffC<br>140.00 + −j11.54 |

| | | Rectangular Form | | Polar Form |
|---|---|---|---|---|
| A > B<br>(VR2) | Fwd Srce<br>Fwd Load<br>Rev Srce<br>Rev Load | −80.00 + −j115.47<br>−60.00 + −j103.92<br>−60.00 + −j103.92<br>−80.00 + −j115.47 | ==<br>==<br>==<br>== | 140.47 V @ −124.7<br>120.00 V @ −120.0<br>120.00 V @ −120.0<br>140.47 V @ −124.7 |
| B > C<br>(VR3) | Fwd Srce<br>Fwd Load<br>Rev Srce<br>Rev Load | −60.00 + j127.01<br>−60.00 + j103.92<br>−60.00 + j103.92<br>−60.00 + j127.01 | ==<br>==<br>==<br>== | 140.47 V @ 115.3<br>120.00 V @ 120.0<br>120.00 V @ 120.0<br>140.47 V @ 115.3 |
| C > A<br>(VR1) | Fwd Srce<br>Fwd Load<br>Rev Srce<br>Rev Load | 140.00 + −j11.54<br>120.00 + j0.00<br>120.00 + j0.00<br>140.00 + −J11.54 | ==<br>==<br>==<br>== | 140.47 V @ −4.7<br>120.00 V @ 0.0<br>120.00 V @ 0.0<br>140.47 V @ −4.7 |

Figure 7:
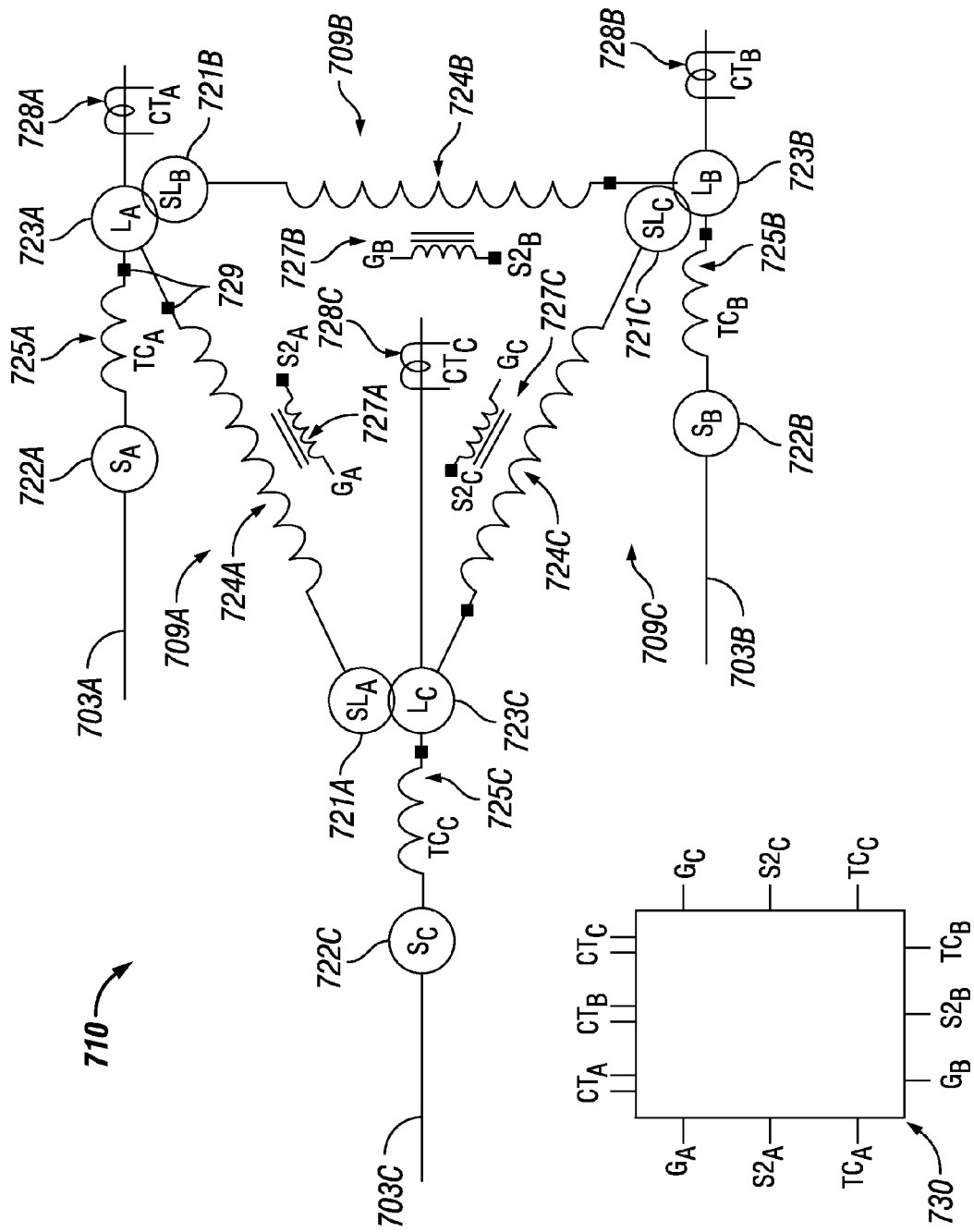
FIG. 7 shows another voltage regulation circuit for three regulated transformers in a multi-phase power system in accordance with certain example embodiments.

FIG. 7 shows another voltage regulation circuit 710 for three phases in a multi-phase power system in accordance with certain example embodiments. The voltage regulation circuit 710 of FIG. 7 is substantially the same as the voltage regulation circuit 610 of FIGS. 6A and 6B above, except as described below. Specifically, the voltage regulation circuit 710 of FIG. 7 does not have a differential/control PT similar to differential/control PT 626 from FIGS. 6A and 6B for any of the three phases. Without PT 626 for any of the regulated transformers 709, the controller 730 has a reduced number of input channels that do not include $S4_A$, $S4_B$, $S4_C$, $G_{A1}$, $G_{B1}$, or $G_{C1}$. Further, rather than the S terminal 722 disposed between the L terminal 723 and the SL terminal 721 for each phase, as was the case in FIGS. 6A and 6B above, the L terminal 723 is disposed between the S terminal 722 and the SL terminal 721 for each phase.

By using the example controller 730 for a multi-phase power system in a closed delta configuration, voltages associated with the S terminal of one phase (e.g., S terminal 722A) to the S terminal of another phase (e.g., S terminal 722B) can be measured and/or calculated to allow for proper voltage regulation in forward and/or reverse power flow mode. Phase-to-phase voltage measurements of S terminals 722 can be performed using a measured voltage across a control PT 727 from one regulated transformer 709 (e.g., PT 726A of regulated transformer 709A), a calculated voltage across non-existent series differential $PT_S$ 727 (e.g., PT 727A and PT 727B) from regulated transformer 709A and regulated transformer 709B. Thus, as discussed below, phase A to phase B (terminal $S_A$ 722A to terminal $S_B$ 722B) voltage becomes the combination of PT 727B (measured between $S2_B$ to $G_B$), non-existent differential PT 727A (a calculated voltage between $S4_A$ to $G_A$), and non-existent differential PT 727B (a calculated voltage between $S4_B$ to $G_B$).

Using the controller 730 in example embodiments, during forward power flow, A-B phase-to-phase load volts measured between $L_A$ to $L_B$ equals the shunt winding 724B of regulated transformer B, which is the measured load voltage between $S2_B$ and $G_B$. Similarly, B-C phase-to-phase load volts $L_B$ to $L_C$ equals the shunt winding 724C of regulated transformer C, which is the measured load voltage between $S2_C$ and $G_C$. The C-A phase-to-phase load volts measured between $L_C$ and $L_A$ equals the shunt winding 724A of regulated transformer A, which is the measured load voltage between $S2_A$ and $G_A$.

Further, using the controller 730 in example embodiments, during forward power flow, A-B phase-to-phase source volts between $S_A$ to $S_B$ equals the shunt winding 724B of regulated transformer B, the series winding 725B of regulated transformer B, and the series winding 725A of regulated transformer A, which in this case is the sum of the measured voltage across shunt PT 727B (measured between $S2_B$ and $G_B$), the calculated differential PT 726B (calculated between $S4_B$ and $G_{B1}$), and the calculated differential PT 726A (calculated between $S4_A$ and $G_{A1}$). Similarly, B-C phase-to-phase source volts measured between $S_B$ to $S_C$ equals the shunt winding 724C of regulated transformer C, the series winding 725C of regulated transformer C, and the series winding 725B of regulated transformer B, which in this case is the sum of the measured source voltage across shunt PT 727C (measured between $S2_C$ and $G_C$), the calculated differential PT 726C (calculated between $S4_C$ and $G_{C1}$), and the calculated differential PT 726B (calculated between $S4_B$ and $G_{B1}$). The C-A phase-to-phase source volts measured between $S_C$ and $S_A$ equals the shunt winding 724A of regulated transformer A, and series winding 725A of regulated transformer A, and the series winding 725C of regulated transformer C, which in this case is the sum of the source voltage across shunt PT 727A (measured between $S2_A$ and $G_A$), the calculated differential PT 726A (calculated between $S4_A$ and $G_{A1}$), and the calculated differential PT 726C (calculated between $S4_C$ and $G_{C1}$).

During reverse power flow, A-B phase-to-phase load volts between $S_A$ to $S_B$ equals the shunt winding 724B of regulated transformer B, the series winding 725B of regulated transformer B, and the series winding 725A of regulated transformer A, which in this case is the sum of the measured voltage across shunt PT 727B (measured between $S2_B$ and $G_B$), the calculated differential PT 726B (calculated between $S4_B$ and $G_{B1}$), and the calculated differential PT 726A (calculated between $S4_A$ and $G_{A1}$). Similarly, B-C phase-to-phase source volts measured between $S_B$ to $S_C$ equals the shunt winding 724C of regulated transformer C, the series winding 725C of regulated transformer C, and the series winding 725B of regulated transformer B, which in this case is the sum of the measured source voltage across shunt PT 727C (measured between $S2_C$ and $G_C$), the calculated differential PT 726C (calculated between $S4_C$ and $G_{C1}$), and the calculated differential PT 726B (calculated between $S4_B$ and $G_{B1}$). The C-A phase-to-phase source volts measured between $S_C$ and $S_A$ equals the shunt winding 724A of regulated transformer A, and series winding 725A of regulated transformer A, and the series winding 725C of regulated transformer C, which in this case is the sum of the source voltage across shunt PT 727A (measured between $S2_A$ and $G_A$), the calculated differential PT 726A (calculated between $S4_A$ and $G_{A1}$), and the calculated differential PT 726C (calculated between S4c and $G_{C1}$).

Further, using the controller 730 in example embodiments, during reverse power flow, A-B phase-to-phase source volts between $L_A$ to $L_B$ equals the shunt winding 724B of regulated transformer B, which is the measured load voltage between $S2_B$ and $G_B$. Similarly, B-C phase-to-phase load volts $L_B$ to $L_C$ equals the shunt winding 724C of regulated transformer C, which is the measured load voltage between $S2_C$ and $G_C$. The C-A phase-to-phase load volts measured between $L_C$ and $L_A$ equals the shunt winding 724A of regulated transformer A, which is the measured load voltage between $S2_A$ and $G_A$.

Figure 8A:
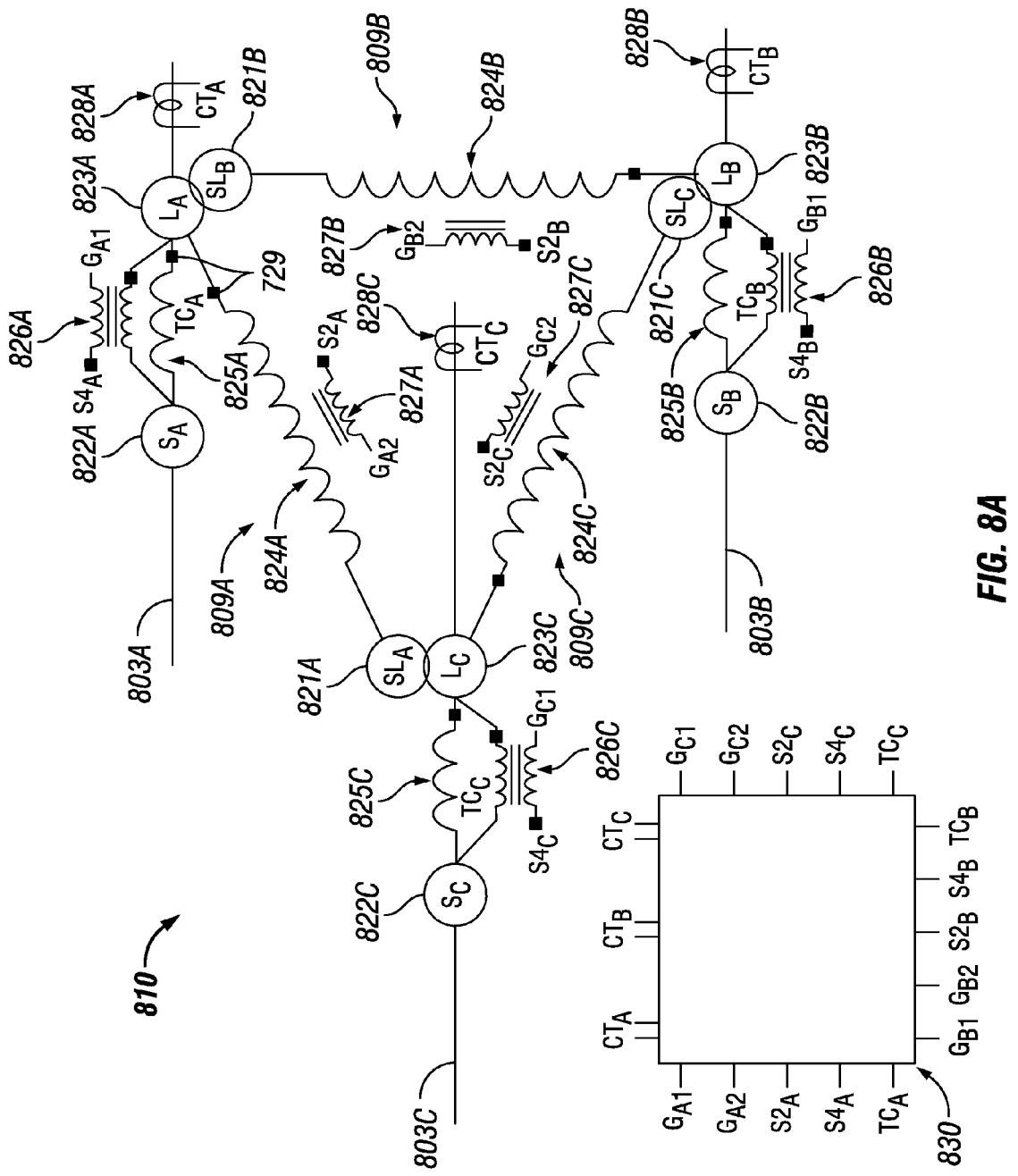
FIGS. 8A and 8B show yet another voltage regulation circuit for three regulated transformers in a multi-phase power system in accordance with certain example embodiments.
Figure 8B:
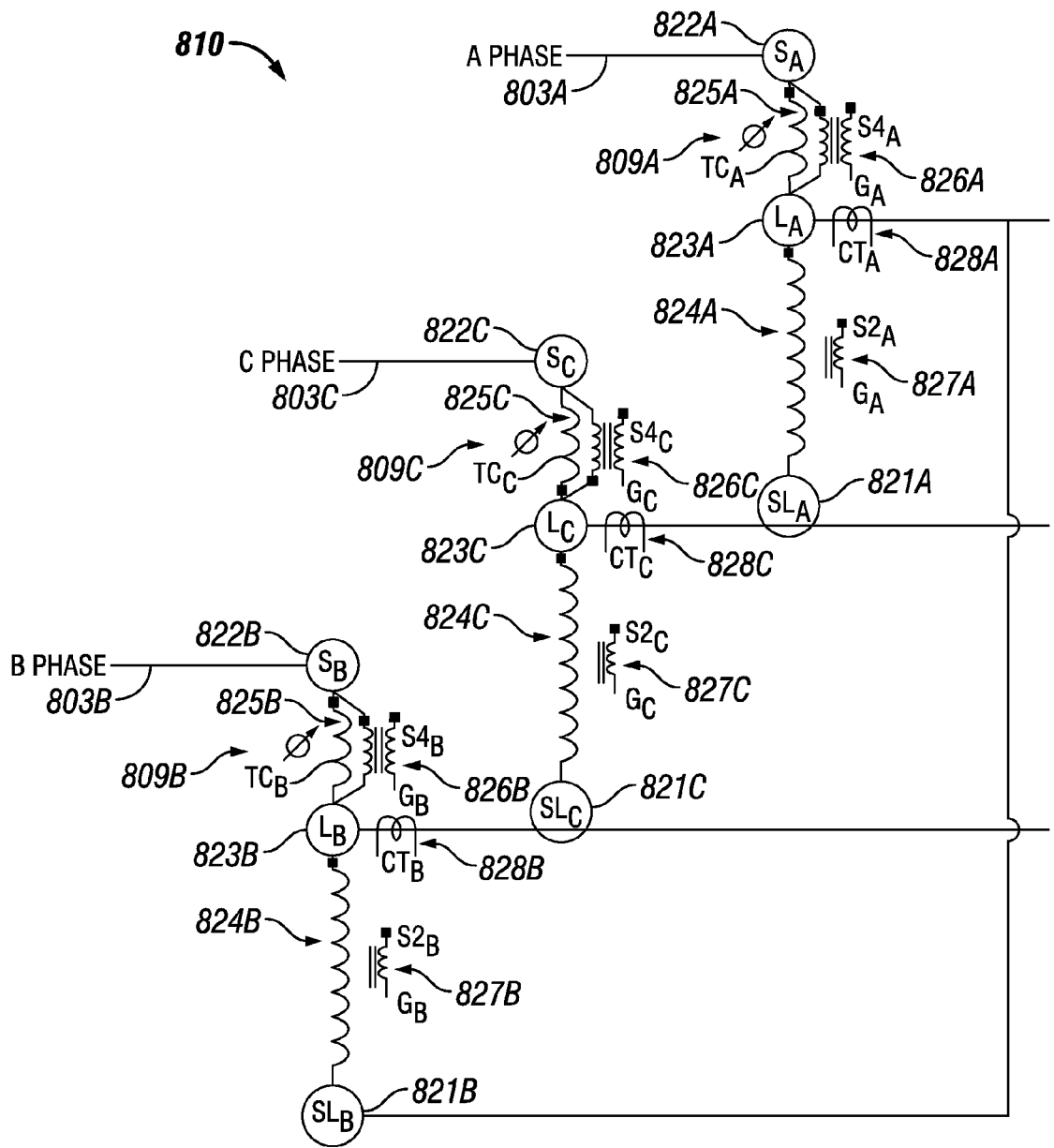

FIGS. 8A and 8B show yet another voltage regulation circuit 810 for three phases in a multi-phase power system in accordance with certain example embodiments. Specifically, FIG. 8A shows a schematic diagram of the voltage regulation circuit 810, including a controller 830, and FIG. 8B shows a varied configuration of the schematic diagram of the voltage regulation circuit 810 of FIG. 8A. The voltage regulation circuit 810 of FIGS. 8A and 8B is substantially the same as the voltage regulation circuit 710 of FIG. 7, except as described below. Specifically, the voltage regulation circuit 810 of FIGS. 8A and 8B includes PT 826 for each of the three regulated transformers 809, where PT 826 is substantially similar to PT 426 from FIGS. 4A and 4B above. Consequently, the input channels and output channels of the controller 830 of FIGS. 8A and 8B are substantially the same as the input channels and output channels of the controller 430 of FIGS. 4A and 4B above.

The determination of the source and load voltages by the controller 730 described above with respect to FIG. 7, both in the forward and reverse directions, is substantially the same as determination of the source and load voltages by the controller 830 described above with respect to FIGS. 8A and 8B, except that any calculated values listed for the controller 730 of FIG. 7 can be measured values for the controller 830 of FIGS. 8A and 8B because PT 826 is in place for each regulated transformer 809 of the voltage regulation circuit 810 of FIGS. 8A and 8B.

The following three tables show how the example controller 830 of FIGS. 8A and 8B measures and calculates values (for both magnitude and phase angle), during both forward and reverse power flows, when 109.09 volts is applied to the S terminal 822A, the L terminal 823A, after adjustment of the selector $TC_A$ of the tap changer (series winding 425A), receives 120.00 volts.

| | | Polar Form | | | |
|---|---|---|---|---|---|
| | | Volts | Angle | | Rectangular Form |
| A (VR1) | L (VS) | 120.00 V @ | 0.0° | = = | 120.00 + j0.00 |
| | DIFF | −13.33 V @ | 0.0° | = = | −13.33 + j0.00 |
| | S (V7) | 133.33 V @ | 0.0° | = = | 133.33 + j0.00 |
| B (VR2) | L (VS) | 120.00 V @ | −120.0° | = = | −60.00 + −j103.92 |
| | DIFF | −13.33 V @ | −120.0° | = = | 6.67 + j11.54 |
| | S (V7) | 133.33 V @ | −120.0° | = = | −66.67 + −j115.47 |

-continued

| | | Polar Form | | | |
|---|---|---|---|---|---|
| | | Volts | Angle | | Rectangular Form |
| C (VR3) | L (VS) | 120.00 V @ | 120.0° | = = | −60.00 + j103.92 |
| | DIFF | −13.33 V @ | 120.0° | = = | 6.67 + −j11.54 |
| | S (V7) | 133.33 V @ | 120.0° | = = | −66.67 + j115.47 |

| Forward Power Flow | |
|---|---|
| Type B Source Volts | Type B Load Volts |
| A > B = DiffA + ShuntB − DiffB<br>−43.64 + j94.47 | A > B = ShuntB = $L_B$<br>−60.00 + −j103.92 |
| B > C = ShuntC + DiffB<br>−60.00 + j85.03 | B > C = ShuntC = $L_C$<br>−60.00 + −j103.92 |
| C > A = DiffC + ShuntA − DiffA<br>103.64 + −j9.45 | C > A = ShuntA = $L_A$<br>120.00 + j0.00 |

| Reverse Power Flow | |
|---|---|
| Type A Source Volts | Type A Load Volts |
| A > B = ShuntB = $L_B$<br>−60.00 + j103.92 | A > B = DiffA + ShuntB − DiffB<br>−43.64 + j94.47 |
| B > C = ShuntC = $L_C$<br>−60.00 + j103.92 | B > C = DiffB + ShuntC + DiffC<br>−60.00 + j85.03 |
| C > A = ShuntA = $L_A$<br>120.00 + j0.00 | C > A = DiffC + ShuntA − DiffA<br>103.64 + j9.45 |

| | | Rectangular Form | | Polar Form |
|---|---|---|---|---|
| A > B<br>(VR2) | Fwd Srce | −43.64 + −j94.47 | = = | 104.06 V @ −114.8 |
| | Fwd Load | −60.00 + −j103.92 | = = | 120.00 V @ −120.0 |
| | Rev Srce | −60.00 + −j103.92 | = = | 120.00 V @ −120.0 |
| | Rev Load | −43.64 + −j94.47 | = = | 104.06 V @ −114.8 |
| B > C<br>(VR3) | Fwd Srce | −60.00 + j85.03 | = = | 104.06 V @ 125.2 |
| | Fwd Load | −60.00 + j103.92 | = = | 120.00 V @ 120.0 |
| | Rev Srce | −60.00 + j103.92 | = = | 120.00 V @ 120.0 |
| | Rev Load | −60.00 + j85.03 | = = | 104.06 V @ 125.2 |
| C > A<br>(VR1) | Fwd Srce | 140.00 + j9.45 | = = | 104.06 V @ 5.2 |
| | Fwd Load | 120.00 + j0.00 | = = | 120.00 V @ 0.0 |
| | Rev Srce | 120.00 + j0.00 | = = | 120.00 V @ 0.0 |
| | Rev Load | 140.00 + j9.45 | = = | 104.06 V @ 5.2 |

The following three tables show how the example controller 830 of FIGS. 8A and 8B measures and calculates values (for both magnitude and phase angle), during both forward and reverse power flows, when 133.33 volts is applied to the S terminal 822A, the L terminal 823A, after adjustment of the selector $TC_A$ of the tap changer (series winding 425A), receives 120.00 volts.

| | | Polar Form | | | |
|---|---|---|---|---|---|
| | | Volts | Angle | | Rectangular Form |
| A<br>(VR1) | L (TB4-VS) | 120.00 V @ | 0.0° | = = | 120.00 + j0.00 |
| | DIFF | 10.90 V @ | 0.0° | = = | 10.90 + j0.00 |
| | S (TB4-V7) | 130.90 V @ | 0.0° | = = | 130.90 + j0.00 |
| B<br>(VR2) | L (TB5-VSB) | 120.00 V @ | −120.0° | = = | −60.00 + −j103.92 |
| | DIFF | 10.90 V @ | −120.0° | = = | −5.45 + −j9.44 |
| | S (TB5-V7B) | 130.90 V @ | −120.0° | = = | −65.45 + −j113.36 |
| C<br>(VR3) | L (TB5-VSC) | 120.00 V @ | 120.0° | = = | −60.00 + j103.92 |
| | DIFF | 10.90 V @ | 120.0° | = = | −5.45 + j9.44 |
| | S (TB5-V7C) | 130.90 V @ | 120.0° | = = | −65.45 + j113.36 |

| Forward Power Flow | |
| --- | --- |
| Type B Source Volts | Type B Load Volts |
| A > B = DiffA + ShuntB − DiffB<br>−76.35 + −j113.36 | A > B = ShuntB = $L_B$<br>−60.00 + −j103.92 |
| B > C = DiffB + ShuntC + DiffC<br>−60.00 + j122.80 | B > C = ShuntC = $L_C$<br>−60.00 + j103.92 |
| C > A = DiffC + ShuntA − DiffA<br>136.35 + −j9.44 | C > A = ShuntA = $L_A$<br>120.00 + j0.00 |
| Reverse Power Flow | |
| Type A Source Volts | Type A Load Volts |
| A > B = ShuntB = $L_B$<br>−60.00 + j103.92 | A > B = DiffA + ShuntB − DiffB<br>−76.35 + j113.36 |
| B > C = ShuntC = $L_C$<br>−60.00 + j103.92 | B > C = DiffB + ShuntC−DiffC<br>−60.00 + j85.03 |
| C > A = ShuntA = $L_A$<br>120.00 + j0.00 | C > A = DiffC + ShuntA− DiffA<br>136.35 + j9.44 |

| | | Rectangular Form | | Polar Form |
| --- | --- | --- | --- | --- |
| A > B<br>(VR2) | Fwd Srce | −76.35 + −j113.36 | = = | 136.68 V @ −124.7 |
| | Fwd Load | −60.00 + −j103.92 | = = | 120.00 V @ −120.0 |
| | Rev Srce | −60.00 + −j103.92 | = = | 120.00 V @ −120.0 |
| | Rev Load | −76.35 + −j113.36 | = = | 136.68 V @ −124.7 |
| B > C<br>(VR3) | Fwd Srce | −60.00 + j122.80 | = = | 136.68 V @ 116.0 |
| | Fwd Load | −60.00 + j103.92 | = = | 120.00 V @ 120.0 |
| | Rev Srce | −60.00 + j103.92 | = = | 120.00 V @ 120.0 |
| | Rev Load | −60.00 + j122.80 | = = | 136.68 V @ 116.0 |
| C > A<br>(VR1) | Fwd Srce | 136.35 + −j9.44 | = = | 136.68 V @ −4.0 |
| | Fwd Load | 120.00 + j0.00 | = = | 120.00 V @ 0.0 |
| | Rev Srce | 120.00 + j0.00 | = = | 120.00 V @ 0.0 |
| | Rev Load | 136.35 + −j9.44 | = = | 136.68 V @ −4.0 |

Figure 9:
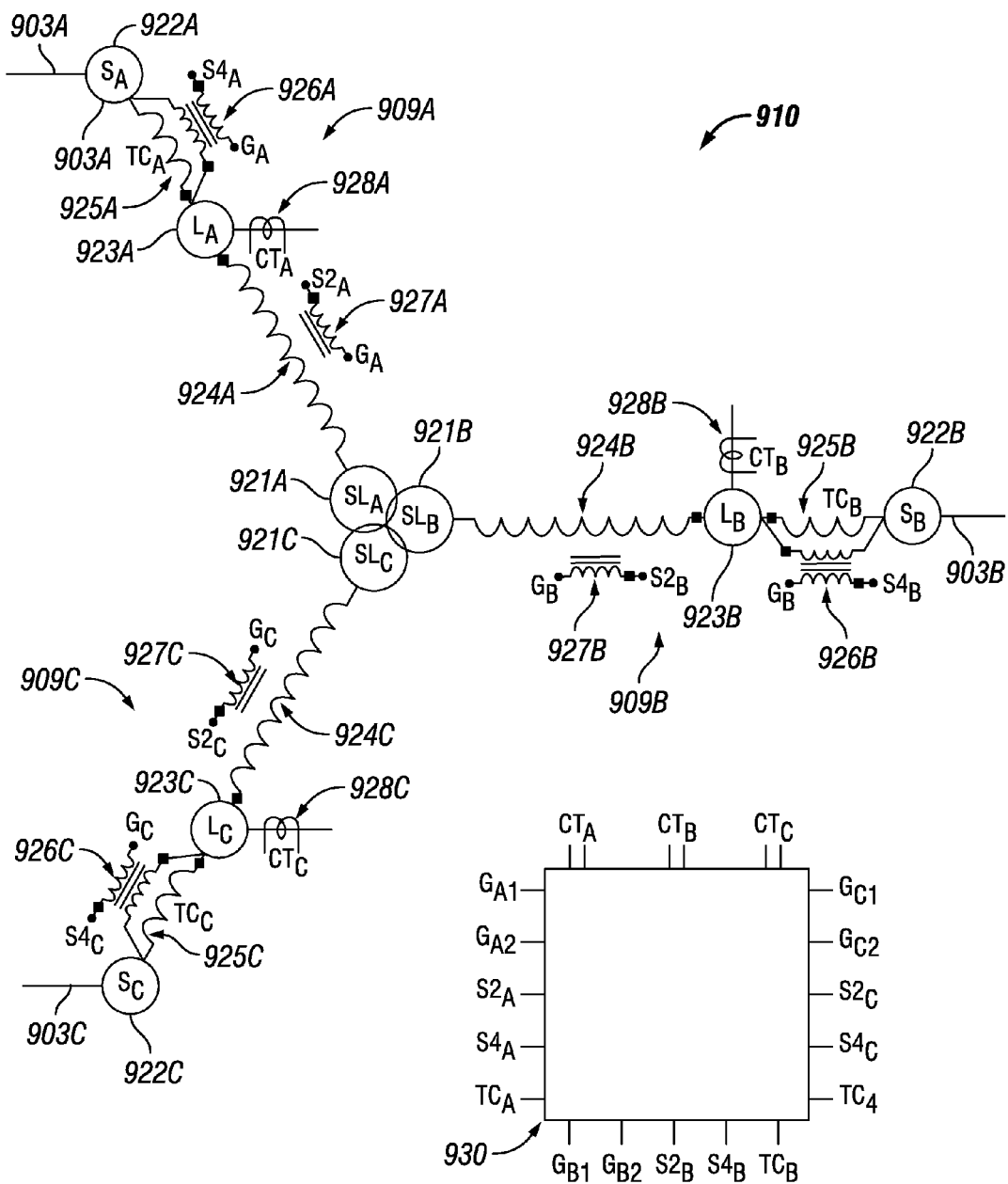
FIGS. 9 and 10 show still other voltage regulation circuits for three regulated transformers in a multi-phase power system in accordance with certain example embodiments.
Figure 10:
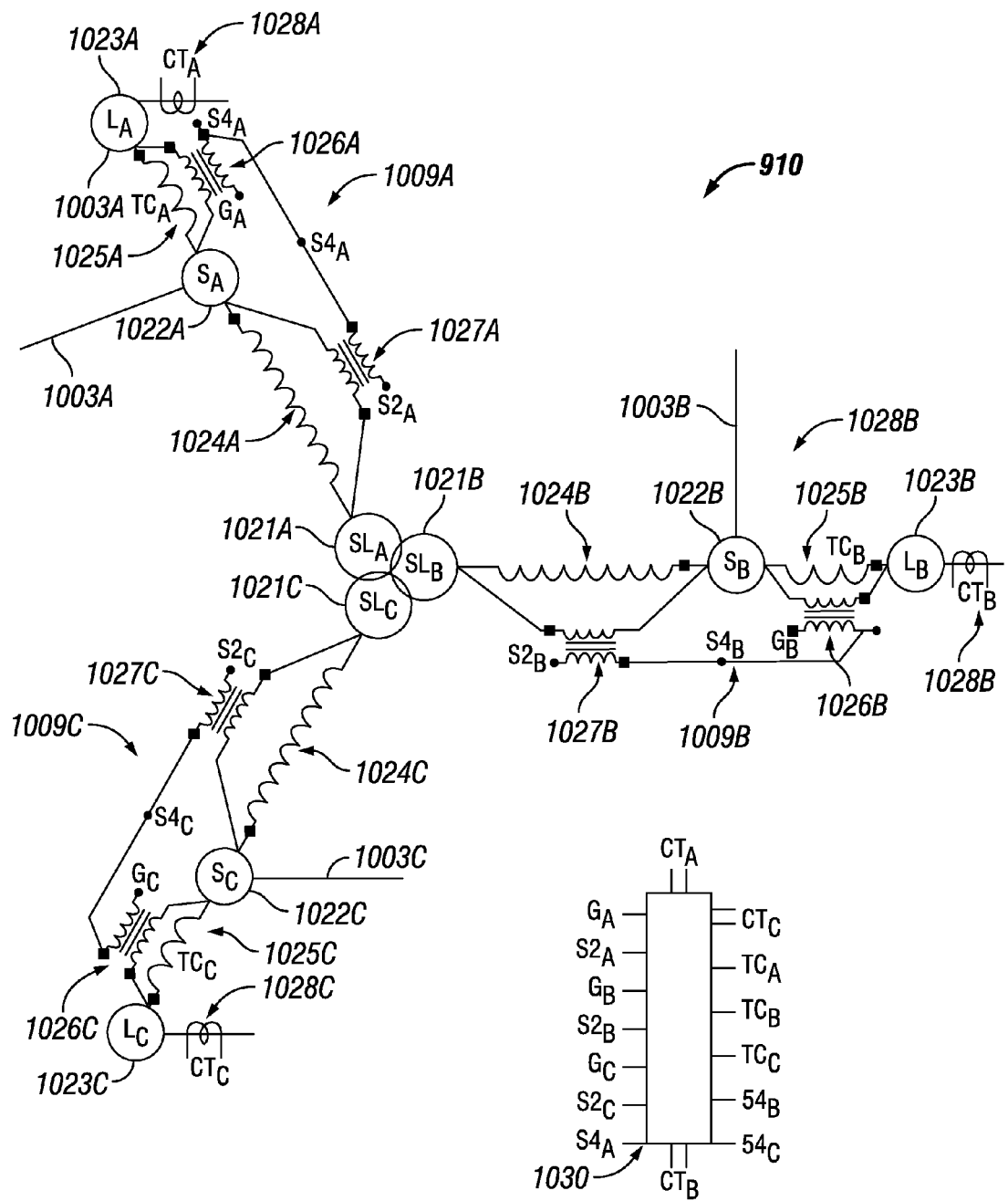

FIGS. 9 and 10 show still other voltage regulation circuits for three phase-to-neutral voltages (sometimes referred to as regulated transformers (regulated transformers 909 in FIG. 9, regulated transformers 1009 in FIG. 10) herein for grounded wye configurations) in a multi-phase power system in accordance with certain example embodiments. FIG. 9 shows a voltage regulation circuit 910 in a grounded wye configuration, and FIG. 10 also shows a voltage regulation circuit 1010 in a grounded wye configuration. With the grounded wye configuration, phase-to-neutral or phase-to-ground voltages are measured and controlled, as opposed to the phase-to-phase voltages of the delta configurations discussed above.

For each phase-to-neutral of the voltage regulation circuit 910 of FIG. 9, PT 926 and PT 927 are not directly coupled to each other. As a result, the controller 930 of FIG. 9 has inputs and outputs substantially similar to those of the controller 830 of FIGS. 8A and 8B. By contrast, for each phase-to-neutral of the voltage regulation circuit 1010 of FIG. 10, PT 1026 and PT 1027 are directly coupled to each other. As a result, the controller 1030 of FIG. 10 has inputs and outputs substantially similar to those of the controller 630 of FIGS. 6A and 6B.

The controller 930 of FIG. 9 and the controller 1030 of FIG. 10 can measure, calculate, and control phase-to-neutral voltages, primary and/or secondary, and phase angle between all three regulated transformers 909 for both source and load. Since a CT (e.g., CT 928, CT 1028) is located at the L terminal (e.g., L terminal 923, L terminal 1023) for each phase-to-neutral, during reverse power flow, a correction for load current is needed due to the exciting current between location of the CT on the L terminal in reference to needed "Load" current on the S terminal (e.g., S terminal 922, S terminal 1022).

Figure 11:
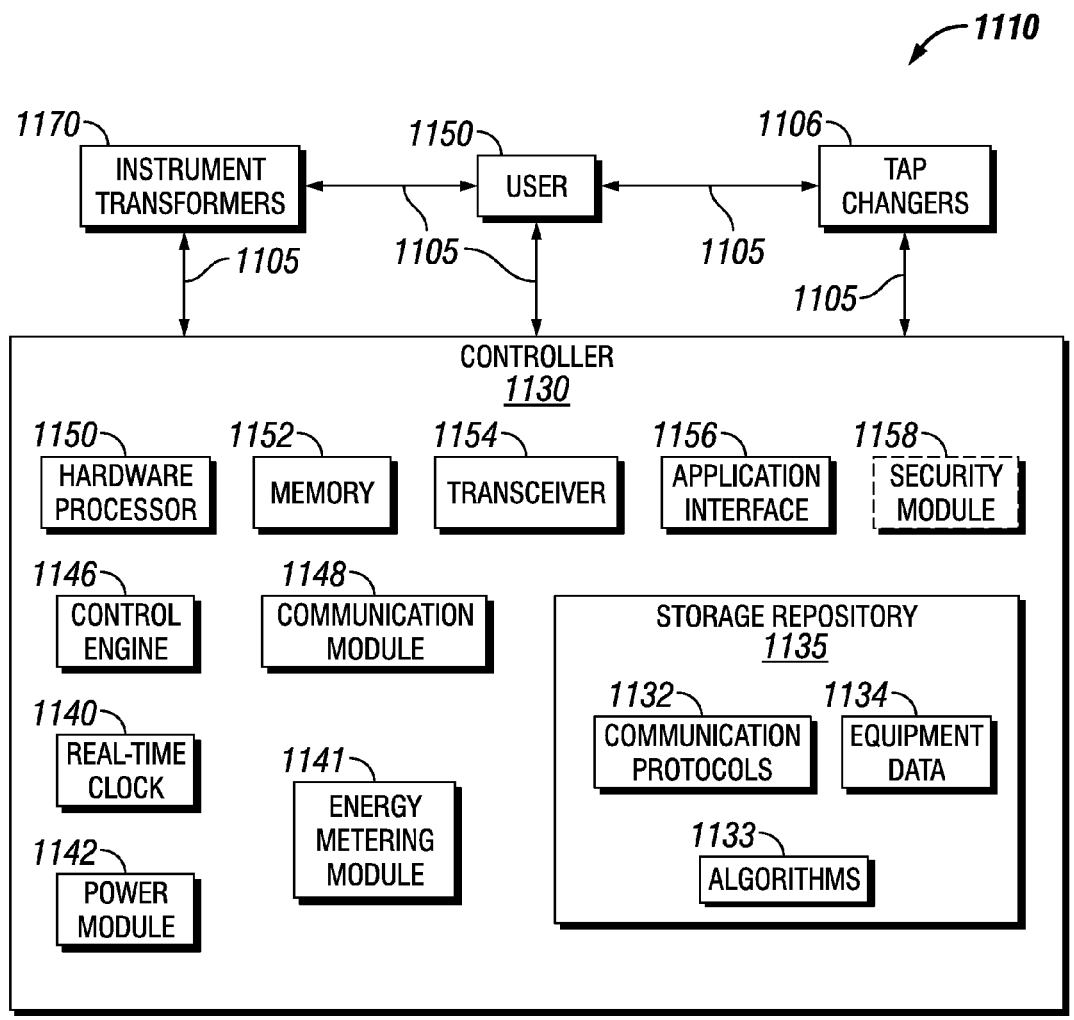
FIG. 11 shows a system diagram of a controller in accordance with certain example embodiments.

FIG. 11 shows a system diagram of a voltage regulation circuit 1110 that includes a controller 1130 in accordance with certain example embodiments. The voltage regulation circuit 1110 can include multiple tap changers 1106, a user 1150, multiple instrument transformers 1170, and the controller 1130. The controller 1130 can include one or more of a number of components. Such components, can include, but are not limited to, a control engine 1146, an energy metering module 1141, a communication module 1148, a real-time clock 1140 (also called a timer 1140), a power module 1142, a storage repository 1135, a hardware processor 1150, a memory 1152, a transceiver 1154, an application interface 1156, and, optionally, a security module 1158.

The storage repository 1135 can include one or more of a number of components, including but not limited to communication protocols 1132, algorithm 1133, and equipment data 1134. The components shown in FIG. 11 are not exhaustive, and in some embodiments, one or more of the components shown in FIG. 11 may not be included in an example controller 1130 and/or voltage regulation circuit 1110. Any component of the example voltage regulation circuit 1110 can be discrete or combined with one or more other components of the voltage regulation circuit 1110.

In certain example embodiments, the controller 1130 does not include a hardware processor 1150. In such a case, the controller 1130 can include, as an example, one or more field programmable gate arrays (FPGA) and/or integrated circuits. Using FPGAs, integrated circuits, and/or other similar devices known in the art allows the controller 1130 (or portions thereof) to be programmable and function according to certain logic rules and thresholds without the use of a hardware processor. Alternatively, FPGAs, integrated circuits, and/or similar devices can be used in conjunction with one or more hardware processors 1150.

The controller 1130 can manage one or more tap changers 1106 by determining (e.g., measuring, calculating) source and load phase-to-phase voltage magnitudes and phase angles in real time, both in forward and reverse directions of power flow. The controller 1130 can combine multi-phase voltage magnitude and phase angle data from two or more phases of power. Three-phase source voltage and load voltages and phase angles determined by the controller 1130 can be calculated as phase-to-phase values and can be actual values, calculated averages (from actual or measured values), and/or any other type of value. Voltages and phase angles determined by the controller 1130 can also be phase-to-neutral that are in addition to, or in the alternative of, phase-to-phase.

In certain example embodiments, the controller 1130 can also determine (e.g., calculate, measure) three-phase values, where such values can include but are not limited to total power, real power, and reactive power. The controller 1130 can have a display, a user interface, and/or some other way (e.g., using the transceiver 1154) of communicating one or more values determined by the controller 1130. The controller 1130 can be used with any multi-phase power system arranged in any of a number of configurations (e.g., open delta, closed delta, grounded wye).

The instrument transformers 1170 can include potential transformers (e.g., PT 627) and current transformers (e.g., CT 828). An instrument transformer can be (or be configured as) load-side, source-side, source-to-load differential, load-to-source differential, or any other suitable type or configuration. The controller 1130 can operate knowing the current configuration of a tap changer 1106, the various available selections of a tap changer 1106, and any other information associated with each tap changer 1106 when regulating voltage. Such information can be stored in the storage repository 1135.

In certain example embodiments, the controller 1130 determines VRegulator configuration for each VR (voltage regulator) in a power system. A VRegulator configuration can be based on one or more of a number of factors, including but not limited to the configuration of other VRs and/or settings of regulator configurations. The controller 1130 can display a number of values. For example, the controller 1130 can display the complimentary Phase to Neutral and Phase to Phase Voltages, Primary and Secondary, Source and Load side of VRegulators, along with average values for each set of values.

As another example, the controller 1130 can display Phase to Neutral Voltage Phase Angle relationship between all phases using a given phase measurement as a reference. As yet another example, the controller 1130 can display Delta Voltage Phase to Phase Angle relationship between all phases using a same given phase measurement as reference. As still another example, the controller 1130 can display true 3 phase Delta Power calculations for kVA, kW and kvar.

For forward power flow in a closed delta configuration, the controller 1130 can substitute the newly calculated DeltaCalc Phase to Phase secondary voltages for those currently being displayed as the "Compensated" voltage. The controller 1130 can use an algorithm 1133 along with the calculated DeltaCalc metering information to make intelligent decisions as to which of the two connected mechanisms (tap changers 1106) would best be adjusted, or if they should be adjusted in tandem, to realize the most stable in-band voltage condition with the least number of tapping operations possible. In such a case, the controller 1130 can use a voting scheme that will always take the other two phase to phase measurements into account before making any one adjustment for out-of-band conditions. In addition, or in the alternative, the controller 1130 can pre-calculate the effect of any possible tapping operations and avoid tapping any mechanism that will drive the additional affected phase out-of-band, if possible.

For forward power flow in an open delta configuration, the controller 1130 can use an algorithm 1133 along with the calculated DeltaCalc metering information to make intelligent decisions as to which of the two connected mechanisms (tap changers 1106) would best be adjusted, or if they should be adjusted in tandem, to realize the most stable in-band voltage condition for the open phase-to-phase calculated voltage with the least number of tapping operations possible. In such a case, the controller 1130 can use a voting scheme that takes the two measured phase-to-phase voltages into account before making any one adjustment for out-of-band conditions. In addition, or in the alternative, the controller 1130 can pre-calculate the effect of any possible tapping operations and avoid tapping any mechanism that will drive the additional affected phase out-of-band, if possible.

For reverse power flow in a closed delta configuration, the controller 1130 can substitute calculated DeltaCalc Phase to Phase secondary voltages for those currently being displayed as the "Compensated" voltage. The controller 1130 can use an algorithm 1133 along with the calculated DeltaCalc metering information to make intelligent decisions as to which of the two connected mechanisms (tap changers 1106) would best be adjusted, or if they should be adjusted in tandem, to realize the most stable in-band voltage condition with the least number of tapping operations possible. In such a case, the controller 1130 can use a voting scheme that will always take the other two phase to phase measurements into account before making any one adjustment for out-of-band conditions. In addition, or in the alternative, the controller 1130 can pre-calculate the effect of any possible tapping operations and avoid tapping any mechanism that will drive the additional affected phase out-of-band, if possible.

For reverse power flow in an open delta configuration, the controller 1130 can use an algorithm 1133 along with the calculated DeltaCalc metering information to make intelligent decisions as to which of the two connected mechanisms would best be adjusted, or if they should be adjusted in tandem, to realize the most stable in-band voltage condition for the open phase-to-phase calculated voltage with the least number of tapping operations possible. In such a case, the controller 1130 can use a voting scheme that takes the two measured phase to phase voltages into account before making any one adjustment for out-of-band conditions. In addition, or in the alternative, the controller 1130 can pre-calculate the effect of any possible tapping operations and avoid tapping any mechanism that will drive the additional affected phase out-of-band, if possible.

Figure 12:
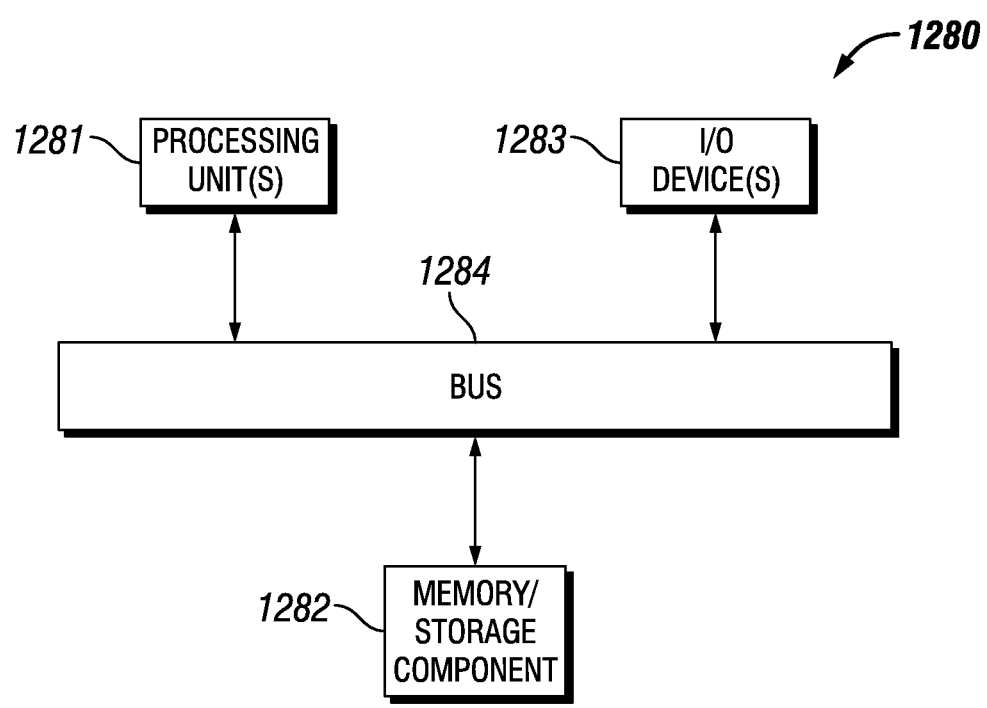
FIG. 12 shows a computer system used for regulating a multi-phase power system in accordance with certain example embodiments.

FIG. 12 illustrates one embodiment of a computing device 1280 capable of implementing one or more of the various techniques described herein, and which may be representative, in whole or in part, of the elements described herein. Computing device 1280 is only one example of a computing device and is not intended to suggest any limitation as to scope of use or functionality of the computing device and/or its possible architectures. Neither should computing device 1280 be interpreted as having any dependency or requirement relating to any one or combination of components illustrated in the example computing device 1280. As shown in FIG. 12, the bus 1284 is operatively coupled to each of the processing unit(s) 1281, the I/O device(s) 1283, and the memory/storage component 1282.

Computing device 1280 includes one or more processors or processing units 1281, one or more memory/storage components 1282, one or more input/output (I/O) devices 1283, and a bus 1284 that allows the various components and devices to communicate with one another. Bus 1284 represents one or more of any of several types of bus structures, including a memory bus or memory controller, a peripheral bus, an accelerated graphics port, and a processor or local bus using any of a variety of bus architectures. Bus 1284 can include wired and/or wireless buses.

Memory/storage component 1282 represents one or more computer storage media. Memory/storage component 1282 may include volatile media (such as random access memory (RAM)) and/or nonvolatile media (such as read only memory (ROM), flash memory, optical disks, magnetic disks, and so forth). Memory/storage component 1282 can include fixed media (e.g., RAM, ROM, a fixed hard drive, etc.) as well as removable media (e.g., a Flash memory drive, a removable hard drive, an optical disk, and so forth).

One or more I/O devices 1283 allow a customer, utility, or other user to enter commands and information to computing device 1280, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 1280 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 1280 includes at least the minimal processing, input, and/or output means necessary to practice one or more embodiments.

Further, those skilled in the art will appreciate that one or more elements of the aforementioned computer device 1280 may be located at a remote location and connected to the other elements over a network. Further, one or more example embodiments may be implemented on a distributed system having a plurality of nodes, where each portion of the implementation (e.g., control engine) may be located on a different node within the distributed system. In one or more embodiments, the node corresponds to a computer system. Alternatively, the node may correspond to a processor with associated physical memory. The node may alternatively correspond to a processor with shared memory and/or resources.

Figure 13A:
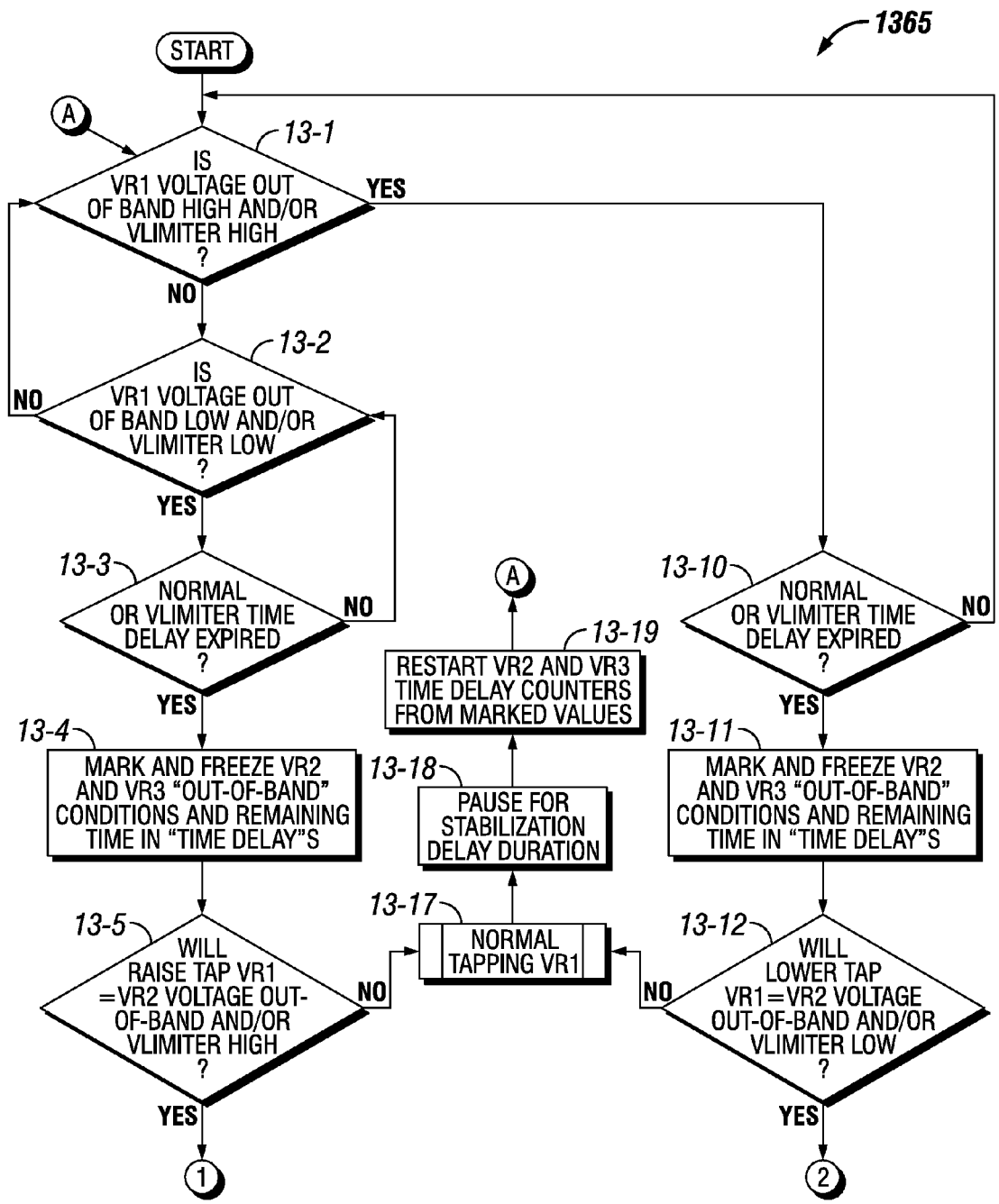
FIGS. 13A and 13B show a flow chart for a method of regulating voltage in accordance with certain example embodiments.
Figure 13B:
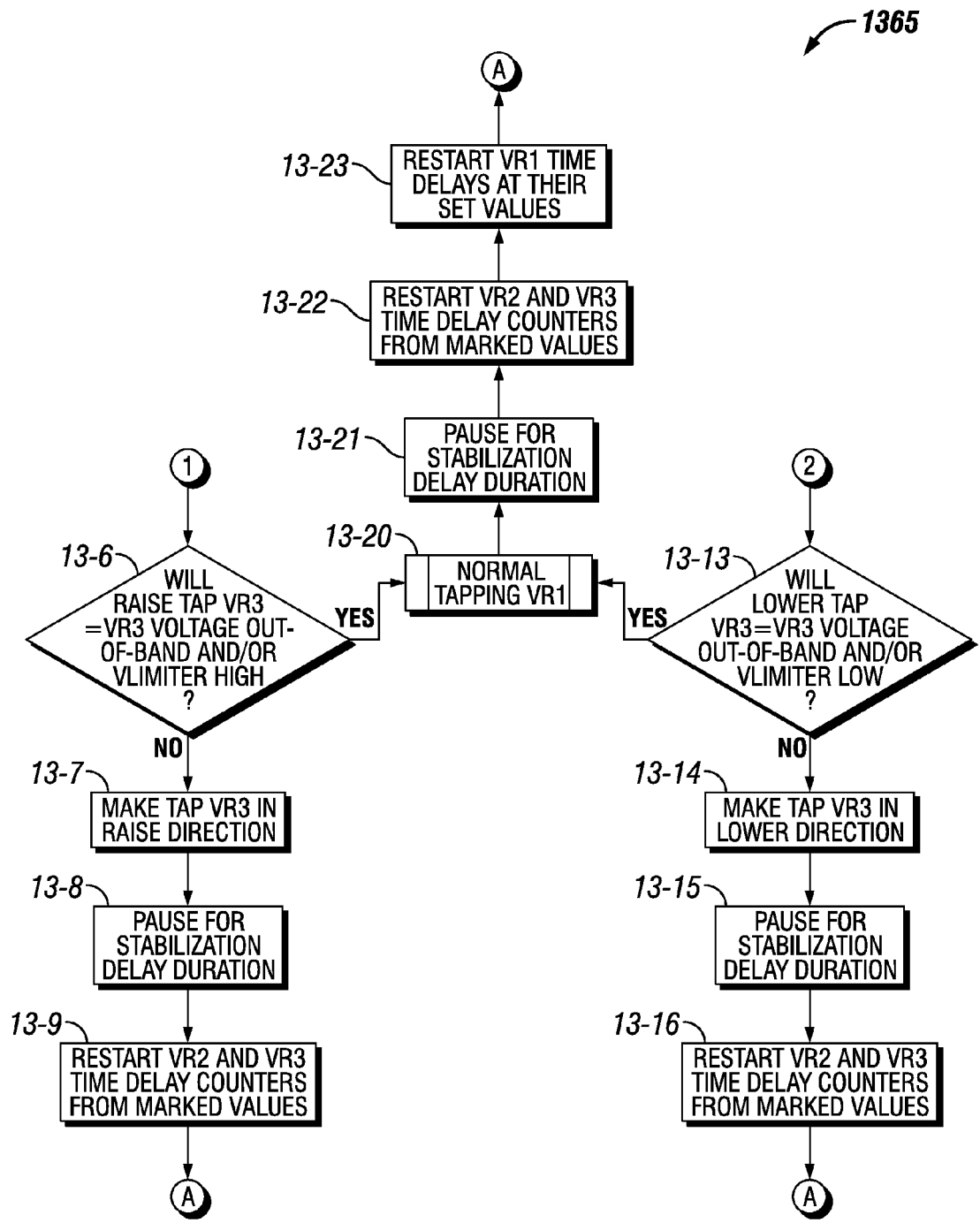

FIGS. 13A and 13B show a flowchart for a method 1365 of regulating voltage in accordance with certain example embodiments. While the various steps in this flowchart are presented sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order.

In addition, a person of ordinary skill in the art will appreciate that additional steps not shown in FIGS. 13A and 13B may be included in performing this method 1365. Accordingly, the specific arrangement of steps should not be construed as limiting the scope. Further, a controller (e.g., controller 1130), which can be a particular computing device, as described, for example, in FIG. 12 above, can be used to perform one or more of the steps (or portions thereof) for the method 1365 described below in certain exemplary embodiments. As an example, the functions of the voltage regulators and the voltage limiters (both discussed below) can be performed by the example controller 1130 and its various components (e.g., the control engine 1146).

Referring to FIGS. 1A-13B, the method 1365 of FIGS. 13A and 13B can be used for up to three voltage regulators (VRs) in a connected closed delta configuration. Stabilization delay can be introduced after each tapping operation, no matter which VR is operated. This allows for the system to stabilize before the need for additional tapping operations can be evaluated and acted upon. When multiple VRs are involved, there is no pre-arranged priority as to which of the delta-connected VRs make adjustments first. For the method 1365 described below, VR1 corresponds to the A-B phase voltage regulator, VR2 corresponds to the B-C phase voltage regulator, and VR3 corresponds to the C-A phase voltage regulator.

The method 1365 of FIGS. 13A and 13B starts at the start step and proceeds to step 13-1, where a determination is made as to whether the voltage of VR1 equals or exceeds the upper limit of the range of acceptable values (out of band) and/or the upper limit of the voltage limiter of VR1. More details about the voltage limiter (also called Vlimiter) is provided below with respect to FIG. 15. Measurements of the voltages can be made by the energy metering module 1141 using one or more instrument transformers 1170. The determinations can be made by the control engine 1146 of the controller 1130. If the voltage of VR1 equals or exceeds the upper limit of the range of acceptable values (out of band) and/or the upper limit of the voltage limiter of VR1, then the process proceeds to step 13-10. If the voltage of VR1 does not equal or exceed the upper limit of the range of acceptable values (out of band) and/or the upper limit of the voltage limiter of VR1, then the process proceeds to step 13-2.

In step 13-2, a determination is made as to whether the voltage of VR1 equals or falls below the lower limit of the range of acceptable values (out of band) and/or the lower limit of the voltage limiter of VR1. Measurements of the voltages can be made by the energy metering module 1141 using one or more instrument transformers 1170. The determinations can be made by the control engine 1146 of the controller 1130. If the voltage of VR1 equals or falls below the lower limit of the range of acceptable values (out of band) and/or the lower limit of the voltage limiter of VR1, then the process proceeds to step 13-3. If the voltage of VR1 does not equal or fall below the lower limit of the range of acceptable values (out of band) and/or the lower limit of the voltage limiter of VR1, then the process reverts to step 13-1.

In step 13-3, a determination is made as to whether a time delay has expired. There can be multiple time delays that are evaluated in this step. For example, one time delay can be a normal time delay, and another time delay can be a Vlimiter time delay. In such a case, this condition can be satisfied if any of the multiple time delays have expired. The time can be measured by the real-time clock 1140. The evaluation as to whether a time delay has expired can be made by the control engine 1146 of the controller 1130. If a time delay has expired, then the process proceeds to step 13-4. If a time delay has not expired, then the process reverts to step 13-2.

In step 13-4, the existing conditions for VR2 and VR3 at the time that a time delay has expired are measured and frozen in place. Further, if there are multiple time delays, then the remaining time of the unexpired time delays are measured and recorded. Further, one time delay or all time delays can be frozen. The measurements of the conditions of VR2 and VR3 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR2 and VR3, which are outside the range of acceptable values (out of band). Further, the control engine 1146 can control the real-time clock 1140 to freeze the time of one or more of the time delays.

In step 13-5, a determination is made as to whether raising (increasing) the tap position of VR1 equals or exceeds the upper limit of the range of acceptable voltage values of VR2 and/or the upper limit of the voltage limiter. Measurements of the voltages can be made by the energy metering module 1141 using one or more instrument transformers 1170. The determinations can be made by the control engine 1146 of the controller 1130. If raising (increasing) the tap position of VR1 equals or exceeds the upper limit of the range of acceptable voltage values of VR2 and/or the upper limit of the voltage limiter, then the process proceeds to step 13-6. If raising (increasing) the tap position of VR1 does not equal or exceed the upper limit of the range of acceptable voltage values of VR2 and/or the upper limit of the voltage limiter, then the process proceeds to step 13-17.

In step 13-6, a determination is made as to whether raising (increasing) the tap position of VR3 equals the upper limit of the range of acceptable voltage values of VR3 and/or the upper limit of the voltage limiter. Measurements of the voltages can be made by the energy metering module 1141 using one or more instrument transformers 1170. The determinations can be made by the control engine 1146 of the controller 1130. If raising (increasing) the tap position of VR3 equals the upper limit of the range of acceptable voltage values of VR3 and/or the upper limit of the voltage limiter, then the process proceeds to step 13-20. If raising (increasing) the tap position of VR3 does not equal the upper limit of the range of acceptable voltage values of VR3 and/or the upper limit of the voltage limiter, then the process proceeds to step 13-7.

In step 13-7, the tap position of VR3 is raised. The tap position can be changed using the tap changers 1106 as controlled by the controller 1130. In step 13-8, a pause is instituted for stabilization of the system in response to changing the tap position of VR3. The pause can be measured by the real-time clock 1140. The control engine 1146 can cease some or all operations during the pause, and then resume those operations after the pause has concluded.

In step 13-9, the time delay counters for VR2 and VR3 are restarted. The counters can be restarted by the control engine 1146 and measured by the real-time clock 1140. The counters can be set for marked values or any other values, as determined by the control engine 1146 and measured and dictated to the real-time clock 1140. When step 13-9 is complete, the process reverts to step 13-1.

In step 13-10, a determination is made as to whether a time delay has expired. There can be multiple time delays that are evaluated in this step. For example, one time delay can be a normal time delay, and another time delay can be a Vlimiter time delay. In such a case, this condition can be satisfied if any of the multiple time delays have expired. The time can be measured by the real-time clock 1140. The evaluation as to whether a time delay has expired can be made by the control engine 1146 of the controller 1130. If a time delay has expired, then the process proceeds to step 13-11. If a time delay has not expired, then the process reverts to step 13-2

In step 13-11, the existing conditions for VR2 and VR3 at the time that a time delay has expired are measured and frozen in place. Further, if there are multiple time delays, then the remaining time of the unexpired time delays are measured and recorded. Further, one time delay or all time delays can be frozen. The measurements of the conditions of VR2 and VR3 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR2 and VR3, which are outside the range of acceptable values (out of band). Further, the control engine 1146 can control the real-time clock 1140 to freeze the time of one or more of the time delays.

In step 13-12, a determination is made as to whether lowering (decreasing) the tap position of VR1 equals or falls below the lower limit of the range of acceptable voltage values of VR2 and/or the lower limit of the voltage limiter. Measurements of the voltages can be made by the energy metering module 1141 using one or more instrument transformers 1170. The determinations can be made by the control engine 1146 of the controller 1130. If lowering (decreasing) the tap position of VR1 equals or falls below the lower limit of the range of acceptable voltage values of VR2 and/or the lower limit of the voltage limiter, then the process proceeds to step 13-13. If lowering (decreasing) the tap position of VR1 does not equal or fall below the lower limit of the range of acceptable voltage values of VR2 and/or the lower limit of the voltage limiter, then the process proceeds to step 13-17.

In step 13-13, a determination is made as to whether lowering (decreasing) the tap position of VR3 equals or falls below the lower limit of the range of acceptable voltage values of VR3 and/or the lower limit of the voltage limiter. Measurements of the voltages can be made by the energy metering module 1141 using one or more instrument transformers 1170. The determinations can be made by the control engine 1146 of the controller 1130. If lowering (decreasing) the tap position of VR3 equals or falls below the lower limit of the range of acceptable voltage values of VR3 and/or the lower limit of the voltage limiter, then the process proceeds to step 13-20. If lowering (decreasing) the tap position of VR3 does not equal or fall below the lower limit of the range of acceptable voltage values of VR3 and/or the lower limit of the voltage limiter, then the process proceeds to step 13-14.

In step 13-14, the tap position of VR3 is lowered. The tap position can be changed using the tap changers 1106 as controlled by the controller 1130. In step 13-15, a pause is instituted for stabilization of the system in response to changing the tap position of VR3. The pause can be measured by the real-time clock 1140. The control engine 1146 can cease some or all operations during the pause, and then resume those operations after the pause has concluded.

In step 13-16, the time delay counters for VR2 and VR3 are restarted. The counters can be restarted by the control engine 1146 and measured by the real-time clock 1140. The counters can be set for marked values or any other values, as determined by the control engine 1146 and measured and dictated to the real-time clock 1140. When step 13-16 is complete, the process reverts to step 13-1.

In step 13-17, normal tapping of VR1 is implemented. The tap position can be changed using the tap changers 1106 as controlled by the controller 1130. In step 13-18, a pause is instituted for stabilization of the system in response to changing the tap position of VR1. The pause can be measured by the real-time clock 1140. The control engine 1146 can cease some or all operations during the pause, and then resume those operations after the pause has concluded.

In step 13-19, the time delay counters for VR2 and VR3 are restarted. The counters can be restarted by the control engine 1146 and measured by the real-time clock 1140. The counters can be set for marked values or any other values, as determined by the control engine 1146 and measured and dictated to the real-time clock 1140. When step 13-19 is complete, the process reverts to step 13-1.

In step 13-20, normal tapping of VR1 is implemented. The tap position can be changed using the tap changers 1106 as controlled by the controller 1130. In step 13-21, a pause is instituted for stabilization of the system in response to changing the tap position of VR1. The pause can be measured by the real-time clock 1140. The control engine 1146 can cease some or all operations during the pause, and then resume those operations after the pause has concluded.

In step 13-22, the time delay counters for VR2 and VR3 are restarted. The counters can be restarted by the control engine 1146 and measured by the real-time clock 1140. The counters can be set for marked values or any other values, as determined by the control engine 1146 and measured and dictated to the real-time clock 1140. In step 13-23, the time delay counters for VR1 are restarted. The counters can be restarted by the control engine 1146 and measured by the real-time clock 1140. The counters can be restarted at their set values, as determined by the control engine 1146 and measured and dictated to the real-time clock 1140. When step 13-23 is complete, the process reverts to step 13-1.

As explained above, the method 1365 of FIGS. 13A and 13B is for a single phase (e.g., A-B phase) of power. The same method can apply to the other phases of power simultaneously. For example, for the method 1365 to apply to the B-C phase of power, the references to VR1 in FIGS. 13A and 13B can be changed to VR2, the references to VR2 in FIGS. 13A and 13B can be changed to VR3, and the references to VR3 in FIGS. 13A and 13B can be changed to VR1. As another example, for the method 1365 to apply to the C-A phase of power, the references to VR1 in FIGS. 13A and 13B can be changed to VR3, the references to VR2 in FIGS. 13A and 13B can be changed to VR1, and the references to VR3 in FIGS. 13A and 13B can be changed to VR2.

Figure 14A:
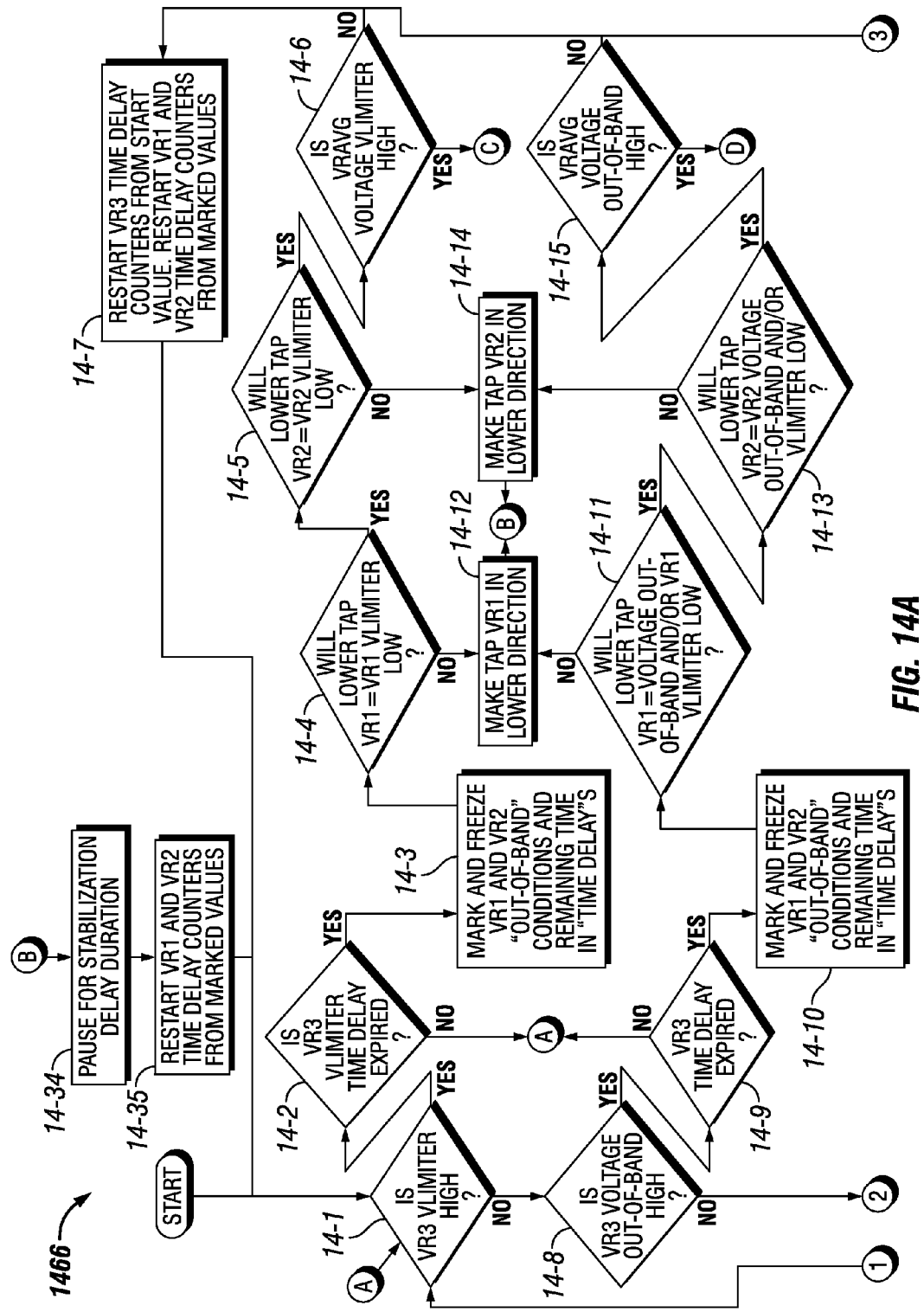
FIGS. 14A-14C show another flow chart for a method of regulating voltage in accordance with certain example embodiments.
Figure 14B:
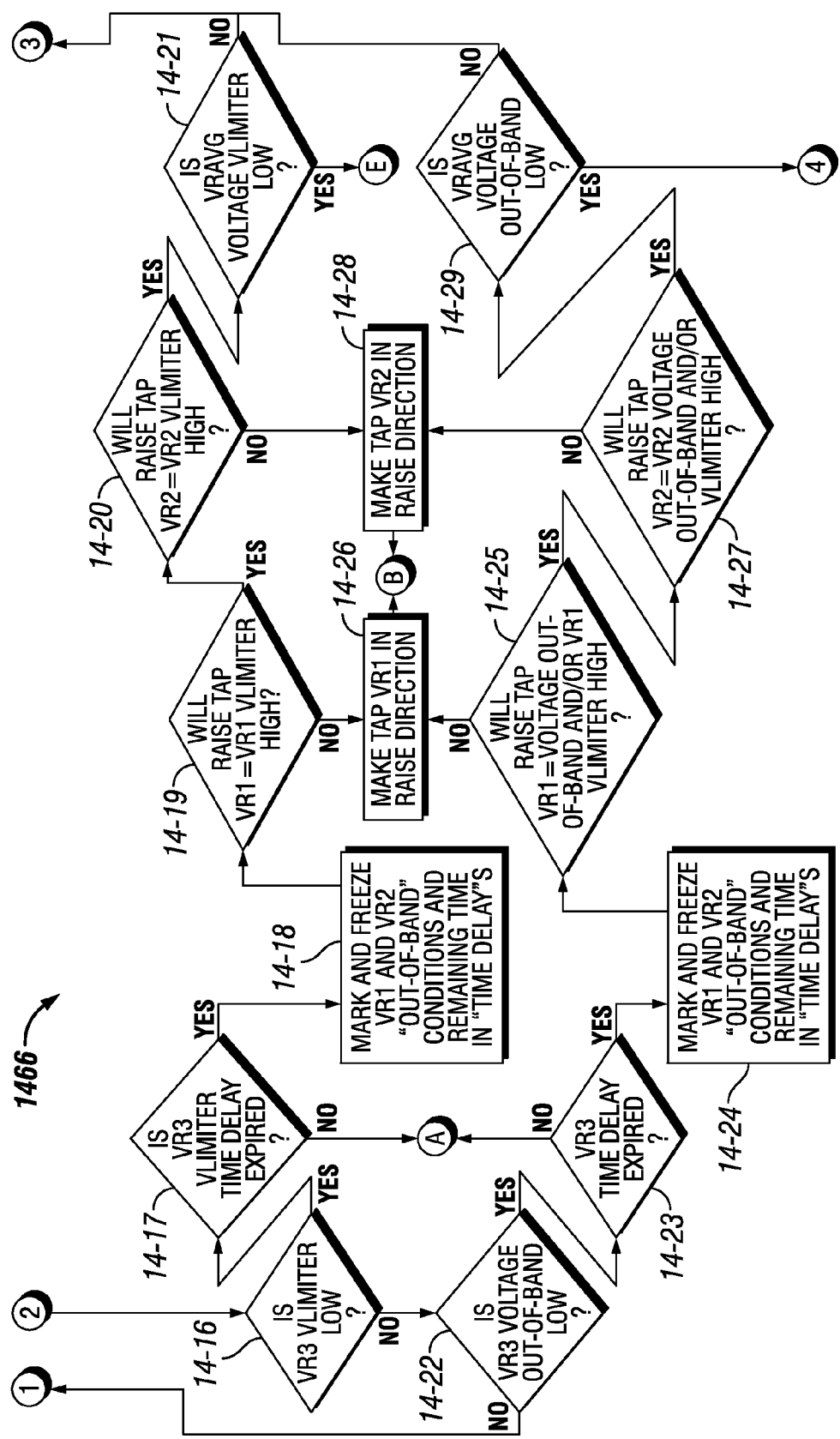
Figure 14C:
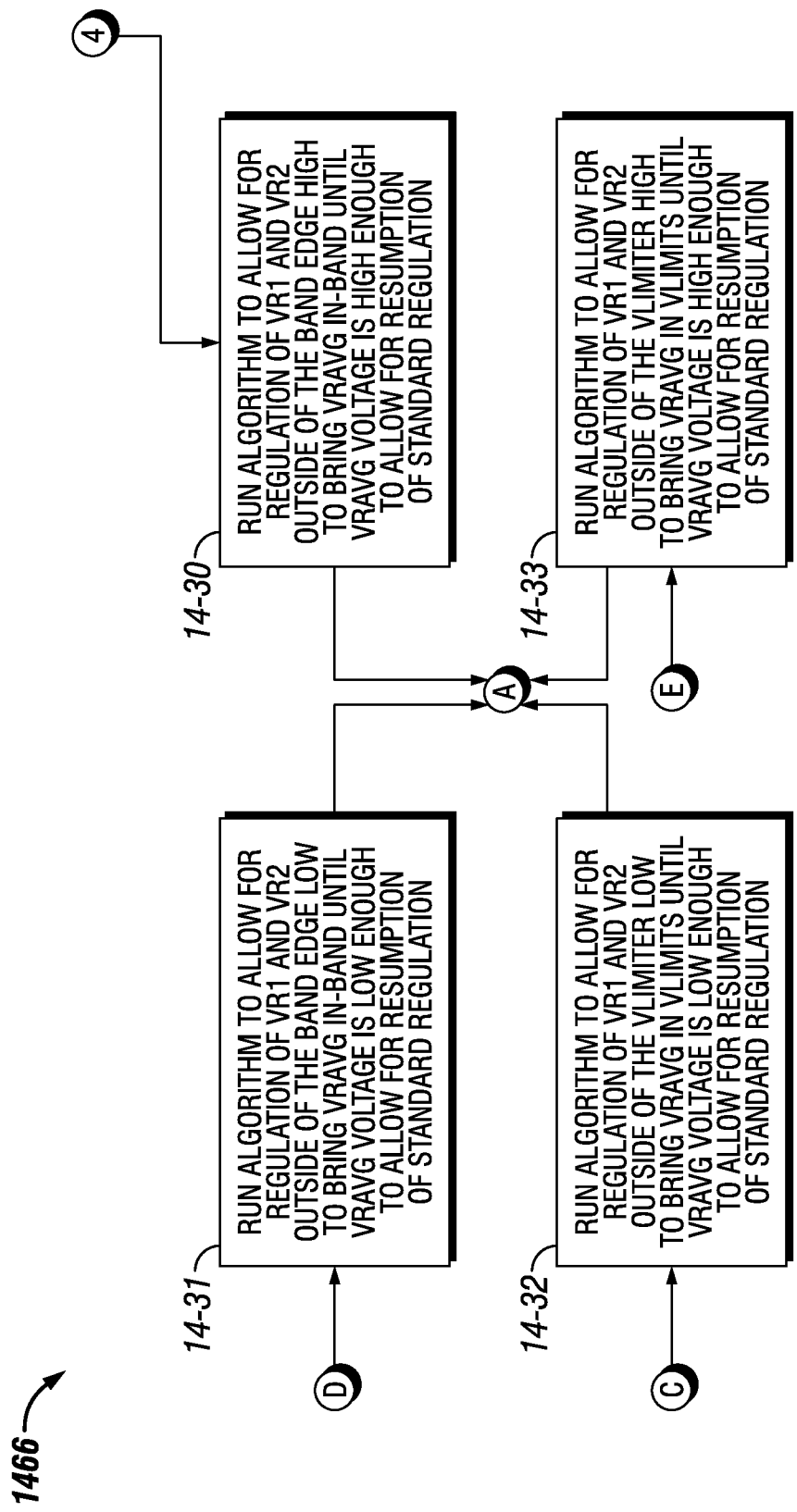

FIGS. 14A-14C shows another flow chart for a method 1466 of regulating voltage in accordance with certain example embodiments. While the various steps in this flowchart are presented sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order.

In addition, a person of ordinary skill in the art will appreciate that additional steps not shown in FIGS. 14A-14C may be included in performing this method 1466. Accordingly, the specific arrangement of steps should not be construed as limiting the scope. Further, a controller (e.g., controller 1130), which can be a particular computing device, as described, for example, in FIG. 12 above, can be used to perform one or more of the steps (or portions thereof) for the method 1466 described below in certain exemplary embodiments. As an example, the functions of the voltage regulators and the voltage limiters (both discussed below) can be performed by the example controller 1130 and its various components (e.g., the control engine 1146).

The method 1466 of FIGS. 14A-14C can be used for two voltage regulators (VRs) in an open delta configuration for both forward and reverse regulation. As discussed above, in this configuration, two phase-to-phase voltages (in this case, A-B and C-B) are monitored and regulated, and the third phase-to-phase voltage (in this case, A-C) is not monitored in this example. This method 1466 allows the controller 1130 to determine the effect of the VRs from any tap change before the tap change is made. Stabilization delay can be introduced after each tapping operation, no matter which VR is operated. This allows for the system to stabilize before the need for additional tapping operations can be evaluated and acted upon. When multiple VRs are involved, there is no pre-arranged priority as to which of the open delta-configured VRs make adjustments first.

For the method 1466 described below, VR1 corresponds to the A-B phase voltage regulator, and VR2 corresponds to the B-C phase voltage regulator. Since there is no C-A voltage regulator, VR3 and C-A values are only applied in a conceptual manner, as they are derived and calculated by the controller 1130 based on available data. Since the open delta configuration only involves two VRs, the controller 1130 uses one or both VRs to affect the phase-to-phase voltage of the missing third "phantom" voltage regulator.

Referring to FIGS. 1A-14, the method 1466 of FIGS. 14A-14C starts at the start step and proceeds to step 14-1, where a determination is made as to whether the calculated VR3 voltage exceeds the set upper limit of the voltage limiter. Measurements of the voltages can be made by the energy metering module 1141 using one or more instrument transformers 1170. The determination can be made by the control engine 1146 of the controller 1130. If the calculated VR3 voltage exceeds the upper limit of the voltage limiter, then the process proceeds to step 14-2. If the calculated VR3 voltage does not exceed the upper limit of the calculated voltage limiter, then the process proceeds to step 14-8.

In step 14-2, a determination is made as to whether the Vlimiter time delay of VR3 has expired. The time can be measured by the real-time clock 1140. The evaluation as to whether the time delay has expired can be made by the control engine 1146 of the controller 1130. If the Vlimiter time delay of VR3 has expired, then the process proceeds to step 14-3. If the Vlimiter time delay of VR3 has not expired, then the process reverts to step 14-1.

In step 14-3, the existing conditions for VR1 and VR2 at the time that the Vlimiter time delay of VR3 has expired are measured and frozen in place. The remaining time of the Vlimiter time delay of VR3 is also recorded. The measurements of the conditions of VR1 and VR2 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR1 and VR2, which are outside the range of acceptable values (out of band). Further, the control engine 1146 can control the real-time clock 1140 to freeze the time of the time delay.

In step 14-4, a determination is made as to whether lowering (decreasing) the tap position of VR1 equals or falls below the lower limit of the voltage limiter for VR1.

Measurements of the voltages can be made by the energy metering module 1141 using one or more instrument transformers 1170. The determinations can be made by the control engine 1146 of the controller 1130. If lowering (decreasing) the tap position of VR1 equals or falls below the lower limit of the voltage limiter of VR1, then the process proceeds to step 14-5. If lowering (decreasing) the tap position of VR1 does not equal or fall below the lower limit of the voltage limiter of VR1, then the process proceeds to step 14-12.

In step 14-5, a determination is made as to whether lowering (decreasing) the tap position of VR2 equals or falls below the lower limit of the voltage limiter for VR2. Measurements of the voltages can be made by the energy metering module 1141 using one or more instrument transformers 1170. The determinations can be made by the control engine 1146 of the controller 1130. If lowering (decreasing) the tap position of VR2 equals or falls below the lower limit of the voltage limiter of VR2, then the process proceeds to step 14-6. If lowering (decreasing) the tap position of VR2 does not equal or fall below the lower limit of the voltage limiter of VR2, then the process proceeds to step 14-14.

In step 14-6, a determination is made as to whether the VRAvg voltage equals or exceeds the upper limit of Vlimiter. Measurements of the voltages can be made by the energy metering module 1141 using one or more instrument transformers 1170. The averaging and determination can be made by the control engine 1146 of the controller 1130. If the VRAvg voltage equals or exceeds the upper limit of Vlimiter, then the process proceeds to step 14-32. If the VRAvg voltage does not equal or exceed the upper limit of Vlimiter, then the process proceeds to step 14-7.

In step 14-7, the VR3 time delay counters are restarted from their initial (start) values. Further, the VR1 and VR2 time delay counters are restarted from their marked values (from step 14-3). The counters are maintained by the real-time clock 1140. Further, the counters can be restarted based on instructions received by the real-time clock 1140 from the control engine 1146 of the controller 1130. After step 14-7 is complete, the process reverts to step 14-1.

In step 14-8, a determination is made as to whether the calculated voltage of VR3 equals or exceeds the upper limit of the range of acceptable values (out of band). Measurements of the voltages can be made by the energy metering module 1141 using one or more instrument transformers 1170. The determinations can be made by the control engine 1146 of the controller 1130. If the calculated voltage of VR3 equals or exceeds the upper limit of the range of acceptable values (out of band), then the process proceeds to step 14-9. If the calculated voltage of VR3 does not equal or exceed the upper limit of the range of acceptable values (out of band), then the process proceeds to step 14-16.

In step 14-9, a determination is made as to whether the time delay period of VR3 has expired. The time delay period is measured by the real-time clock 1140. The control engine 1146 of the controller 1130 can determine if the time delay period has expired. If the time delay period of VR3 has expired, then the process proceeds to step 14-10. If the time delay period of VR3 has not expired, then the process reverts to step 14-1.

In step 14-10, the existing conditions for VR1 and VR2 at the time that the time delay of VR3 has expired are measured and frozen in place. Further, if the time delays for VR1 and VR2 have not expired, then the remaining time of those unexpired time delays are measured and recorded. The measurements of the conditions of VR1 and VR2 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR1 and VR2, which are outside the range of acceptable values (out of band). Further, the control engine 1146 can control the real-time clock 1140 to freeze the time of one or more of the time delays.

In step 14-11, a determination is made as to whether lowering (decreasing) the tap position of VR1 equals or falls below the lower limit of the range of acceptable voltage values of VR1 and/or the lower limit of the voltage limiter of VR1. Measurements of the voltages can be made by the energy metering module 1141 using one or more instrument transformers 1170. The determinations can be made by the control engine 1146 of the controller 1130. If lowering (decreasing) the tap position of VR1 equals or falls below the lower limit of the range of acceptable voltage values of VR1 and/or the lower limit of the voltage limiter of VR1, then the process proceeds to step 14-13. If lowering (decreasing) the tap position of VR1 does not equal or fall below the lower limit of the range of acceptable voltage values of VR1 and/or the lower limit of the voltage limiter of VR1, then the process proceeds to step 14-12.

In step 14-12, the tap position of VR1 is lowered. The tap position can be changed using the tap changers 1106 as controlled by the control engine of the controller 1130. When step 14-12 is complete, the process proceeds to step 14-34.

In step 14-13, a determination is made as to whether lowering (decreasing) the tap position of VR2 equals or falls below the lower limit of the range of acceptable voltage values of VR2 and/or the lower limit of the voltage limiter of VR2. Measurements of the voltages can be made by the energy metering module 1141 using one or more instrument transformers 1170. The determinations can be made by the control engine 1146 of the controller 1130. If lowering (decreasing) the tap position of VR2 equals or falls below the lower limit of the range of acceptable voltage values of VR2 and/or the lower limit of the voltage limiter of VR2, then the process proceeds to step 14-15. If lowering (decreasing) the tap position of VR2 does not equal or fall below the lower limit of the range of acceptable voltage values of VR2 and/or the lower limit of the voltage limiter of VR2, then the process proceeds to step 14-14.

In step 14-14, the tap position of VR2 is lowered. The tap position can be changed using the tap changers 1106 as controlled by the control engine of the controller 1130. When step 14-14 is complete, the process proceeds to step 14-34.

In step 14-15, a determination is made as to whether the VRAvg voltage equals or exceeds the upper limit of the range of acceptable values (out of band). Measurements of the voltages can be made by the energy metering module 1141 using one or more instrument transformers 1170. The averaging and determination can be made by the control engine 1146 of the controller 1130. If the VRAvg voltage equals or exceeds the upper limit of the range of acceptable values (out of band), then the process proceeds to step 14-31. If the VRAvg voltage does not equal or exceed the upper limit of the range of acceptable values (out of band), then the process reverts to step 14-7.

In step 14-16, a determination is made as to whether the calculated voltage falls below the lower limit of the voltage limiter of VR3. Measurements of the voltages can be made by the energy metering module 1141 using one or more instrument transformers 1170. The determination can be made by the control engine 1146 of the controller 1130. If the voltage falls below the lower limit of the voltage limiter of VR3, then the process proceeds to step 14-17. If the voltage does not fall below the lower limit of the voltage limiter of VR3, then the process proceeds to step 14-22.

In step 14-17, a determination is made as to whether the Vlimiter time delay of VR3 has expired. The time can be measured by the real-time clock 1140. The evaluation as to whether the time delay has expired can be made by the control engine 1146 of the controller 1130. If the Vlimiter time delay of VR3 has expired, then the process proceeds to step 14-18. If the Vlimiter time delay of VR3 has not expired, then the process reverts to step 14-1.

In step 14-18, the existing conditions for VR1 and VR2 at the time that the Vlimiter time delay of VR3 has expired are measured and frozen in place. Further, if the time delays for VR1 and VR2 have not expired, then the remaining time of those unexpired time delays are measured and recorded. The measurements of the conditions of VR1 and VR2 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR1 and VR2, which are outside the range of acceptable values (out of band). Further, the control engine 1146 can control the real-time clock 1140 to freeze the time of one or more of the time delays.

In step 14-19, a determination is made as to whether raising (increasing) the tap position of VR1 equals or exceeds the upper limit of the voltage limiter for VR1. Measurements of the voltages can be made by the energy metering module 1141 using one or more instrument transformers 1170. The determinations can be made by the control engine 1146 of the controller 1130. If raising (increasing) the tap position of VR1 equals or exceeds the upper limit of the voltage limiter of VR1, then the process proceeds to step 14-20. If raising (increasing) the tap position of VR1 does not equal or exceed the upper limit of the voltage limiter of VR1, then the process proceeds to step 14-26.

In step 14-20, a determination is made as to whether raising (increasing) the tap position of VR2 equals or exceeds the upper limit of the voltage limiter for VR2. Measurements of the voltages can be made by the energy metering module 1141 using one or more instrument transformers 1170. The determinations can be made by the control engine 1146 of the controller 1130. If raising (increasing) the tap position of VR2 equals or exceeds the upper limit of the voltage limiter of VR2, then the process proceeds to step 14-21. If raising (increasing) the tap position of VR2 does not equal or exceed the upper limit of the voltage limiter of VR2, then the process proceeds to step 14-28.

In step 14-21, a determination is made as to whether the VRAvg voltage equals or falls below the lower limit of Vlimiter. Measurements of the voltages can be made by the energy metering module 1141 using one or more instrument transformers 1170. The averaging and determination can be made by the control engine 1146 of the controller 1130. If the VRAvg voltage equals or falls below the lower limit of Vlimiter, then the process proceeds to step 14-33. If the VRAvg voltage does not equal or fall below the lower limit of Vlimiter, then the process reverts to step 14-7.

In step 14-22, a determination is made as to whether the calculated voltage of VR3 equals or falls below the lower limit of the range of acceptable values (out of band). Measurements of the voltages can be made by the energy metering module 1141 using one or more instrument transformers 1170. The determinations can be made by the control engine 1146 of the controller 1130. If the calculated voltage of VR3 equals or falls below the lower limit of the range of acceptable values (out of band), then the process proceeds to step 14-23. If the calculated voltage of VR3 does not equal or fall below the lower limit of the range of acceptable values (out of band), then the process reverts to step 14-1.

In step 14-23, a determination is made as to whether the time delay period of VR3 has expired. The time delay period is measured by the real-time clock 1140. The control engine 1146 of the controller 1130 can determine if the time delay period has expired. If the time delay period of VR3 has expired, then the process proceeds to step 14-24. If the time delay period of VR3 has not expired, then the process reverts to step 14-1.

In step 14-24, the existing conditions for VR1 and VR2 at the time that the time delay of VR3 has expired are measured and frozen in place. Further, if the time delays for VR1 and VR2 have not expired, then the remaining time of those unexpired time delays are measured and recorded. The measurements of the conditions of VR1 and VR2 can be made by the energy metering module 1141 using one or more instrument transformers 1170. The time can be measured by the real-time clock 1140. The measured information can be stored in the storage repository 1135 by the control engine 1146 of the controller 1130. The control engine 1146 can also freeze the conditions of VR1 and VR2, which are outside the range of acceptable values (out of band). Further, the control engine 1146 can control the real-time clock 1140 to freeze the time of one or more of the time delays.

In step 14-25, a determination is made as to whether raising (increasing) the tap position of VR1 equals or exceeds the upper limit of the range of acceptable voltage values of VR1 and/or the upper limit of the voltage limiter of VR1. Measurements of the voltages can be made by the energy metering module 1141 using one or more instrument transformers 1170. The determinations can be made by the control engine 1146 of the controller 1130. If raising (increasing) the tap position of VR1 equals or exceeds the upper limit of the range of acceptable voltage values of VR1 and/or the upper limit of the voltage limiter of VR1, then the process proceeds to step 14-27. If raising (increasing) the tap position of VR1 does not equal or exceed the upper limit of the range of acceptable voltage values of VR1 and/or the upper limit of the voltage limiter of VR1, then the process proceeds to step 14-26.

In step 14-26, the tap position of VR1 is increased (raised). The tap position can be changed using the tap changers 1106 as controlled by the control engine of the controller 1130. When step 14-26 is complete, the process proceeds to step 14-34.

In step 14-27, a determination is made as to whether raising (increasing) the tap position of VR2 equals or exceeds the upper limit of the range of acceptable voltage values of VR2 and/or the upper limit of the voltage limiter of VR2. Measurements of the voltages can be made by the energy metering module 1141 using one or more instrument transformers 1170. The determinations can be made by the control engine 1146 of the controller 1130. If raising (increasing) the tap position of VR2 equals or exceeds the upper limit of the range of acceptable voltage values of VR2 and/or the upper limit of the voltage limiter of VR2, then the process proceeds to step 14-29. If raising (increasing) the tap position of VR2 does not equal or exceed the upper limit of the range of acceptable voltage values of VR2 and/or the upper limit of the voltage limiter of VR2, then the process proceeds to step 14-28.

In step 14-28, the tap position of VR2 is increased (raised). The tap position can be changed using the tap changers 1106 as controlled by the control engine of the controller 1130. When step 14-26 is complete, the process proceeds to step 14-34.

In step 14-29, a determination is made as to whether the VRAvg voltage equals or falls below the lower limit of the range of acceptable values (out of band). Measurements of the voltages can be made by the energy metering module 1141 using one or more instrument transformers 1170. The averaging and determination can be made by the control engine 1146 of the controller 1130. If the VRAvg voltage equals or falls below the lower limit of the range of acceptable values (out of band), then the process proceeds to step 14-30. If the VRAvg voltage does not equal or fall below the lower limit of the range of acceptable values (out of band), then the process reverts to step 14-7.

In step 14-30, the voltage of VR1 and VR2 is allowed to run above the upper limit of the range of acceptable values of VR1 and VR2 long enough to bring the VRAvg voltage above the lower limit of the range of acceptable values to bring the VRAvg voltage back in band at a high enough level to allow the resumption of standard regulation. Measurements of the voltages can be made by the energy metering module 1141 using one or more instrument transformers 1170. The averaging and determination can be made by the control engine 1146 of the controller 1130. Similarly, the resumption of standard regulation can be made and implemented by the control engine 1146 of the controller 1130. When step 14-30 is complete, the process reverts to step 14-1.

In step 14-31, the voltage of VR1 and VR2 is allowed to run below the lower limit of the range of acceptable values of VR1 and VR2 long enough to bring the VRAvg voltage below the upper limit of the range of acceptable values to bring the VRAvg voltage back in band at a low enough level to allow the resumption of standard regulation. Measurements of the voltages can be made by the energy metering module 1141 using one or more instrument transformers 1170. The averaging and determination can be made by the control engine 1146 of the controller 1130. Similarly, the resumption of standard regulation can be made and implemented by the control engine 1146 of the controller 1130. When step 14-31 is complete, the process reverts to step 14-1.

In step 14-32, the voltage of VR1 and VR2 is allowed to run below the lower limit of the voltage limiter of VR1 and VR2 long enough to bring the voltage limiter of VRAvg (the average of voltage limiter VR1, VR2, and VR3) below the upper limit of the range of acceptable values to bring the voltage limiter of VRAvg back in band at a low enough level to allow the resumption of standard regulation. Measurements of the voltages can be made by the energy metering module 1141 using one or more instrument transformers 1170. The averaging and determination can be made by the control engine 1146 of the controller 1130. Similarly, the resumption of standard regulation can be made and implemented by the control engine 1146 of the controller 1130. When step 14-32 is complete, the process reverts to step 14-1.

In step 14-33, the voltage of VR1 and VR2 is allowed to run above the upper limit of the voltage limiter of VR1 and VR2 long enough to bring the voltage limiter of VRAvg above the lower limit of the range of acceptable values to bring the VRAvg voltage back in band at a high enough level to allow the resumption of standard regulation. Measurements of the voltages can be made by the energy metering module 1141 using one or more instrument transformers 1170. The averaging and determination can be made by the control engine 1146 of the controller 1130. Similarly, the resumption of standard regulation can be made and implemented by the control engine 1146 of the controller 1130. When step 14-33 is complete, the process reverts to step 14-1.

In step 14-34, a pause is instituted for stabilization of the system in response to changing the tap position of VR1 and/or VR2. The pause can be measured by the real-time clock 1140. The control engine 1146 can cease some or all operations during the pause, and then resume those operations after the pause has concluded. In step 14-35, the time delay counters for VR1 and VR2 are restarted. The counters can be restarted by the control engine 1146 and measured by the real-time clock 1140. The counters can be set for marked values or any other values, as determined by the control engine 1146 and measured and dictated to the real-time clock 1140. When step 14-35 is complete, the process reverts to step 14-1.

As explained above, the method 1466 of FIGS. 14A-14C is for a single phase-to-phase (e.g., A-B phase) component of power. The same method can apply to the other phase-to-phase components of power. For example, for the method 1466 to apply to the B-C phase-to-phase component of power, the references to VR1 in FIGS. 14A-14C can be changed to VR2, the references to VR2 in FIGS. 14A-14C can be changed to VR3, and the references to calculated VR3 in FIGS. 14A-14C can be changed to calculated VR1. As another example, for the method 1466 to apply to the C-A phase-to-phase component of power, the references to VR1 in FIGS. 14A-14C can be changed to VR3, the references to VR2 in FIGS. 14A-14C can be changed to VR1, and the references to calculated VR3 in FIGS. 14A-14C can be changed to calculated VR2.

Figure 15:
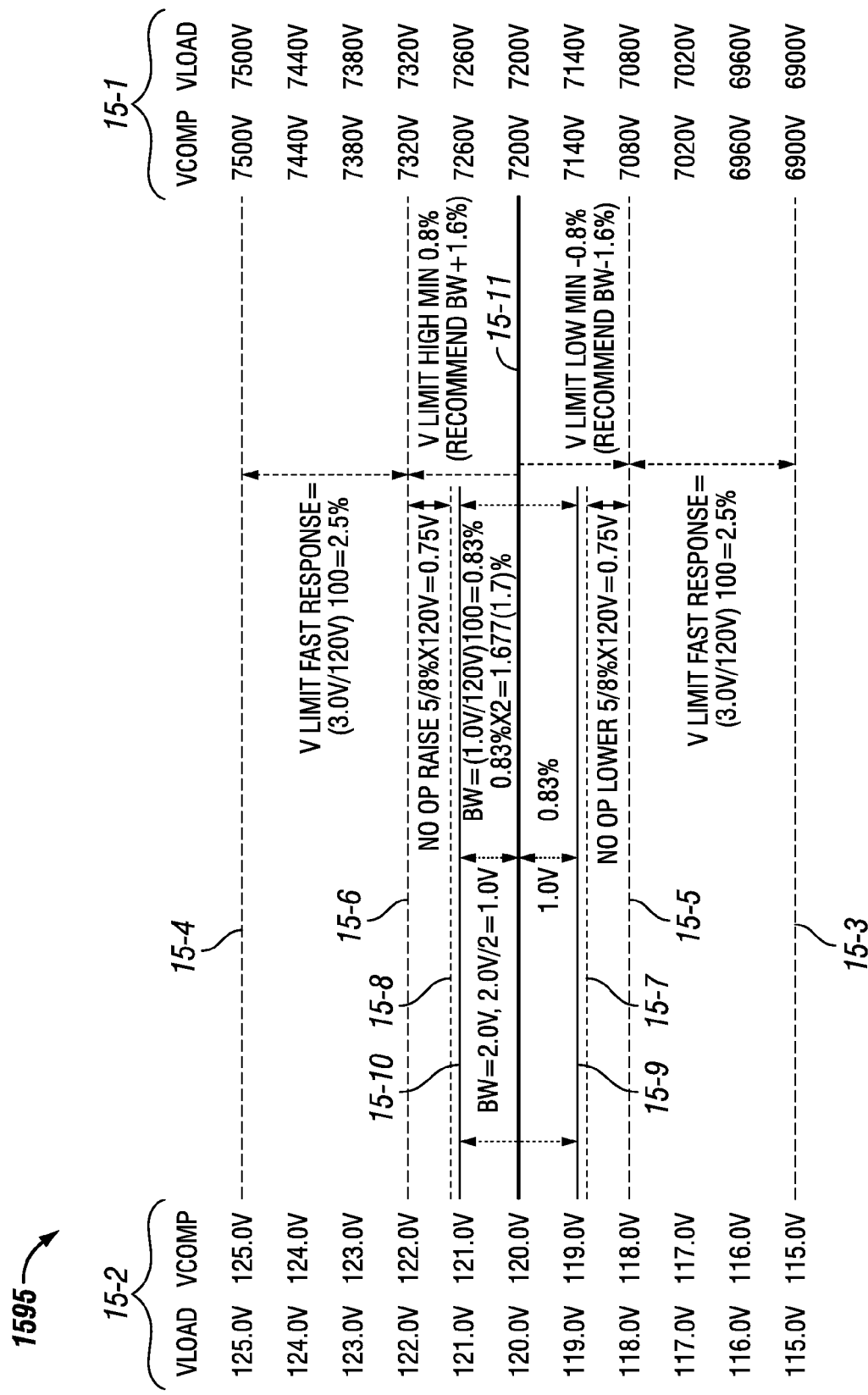
FIG. 15 is a graph showing how upper and lower limits of a voltage limiter and a range of acceptable values can be established and maintained during operations using example embodiments.

FIG. 15 is a graph 1595 showing how upper and lower limits of a voltage limiter and a range of acceptable values can be established and maintained during operations using example embodiments. Referring to FIGS. 1A-15, the graph 1595 of FIG. 15 has a horizontal axis 15-11 that represents 120.0V of power on the secondary side of the transformer (the scale of which is shown as 15-2) and 7200V of power on the primary side of the transformer (the scale of which is shown as 15-1).

The range of normal operations (as discussed in the methods of FIGS. 13 and 14 above) is bounded by an upper limit 15-10 (121 VAC) and a lower limit 15-9 (119 VAC). In this way, the range of normal operations is 2 VAC centered around 120 VAC. The example controller 1130 operates to maintain the voltage on the secondary side of the transformer (also called the delivered voltage) to remain within this range of normal operations. However, to the extent that the delivered voltage exceeds the range of normal operations, the controller 1130 operates within the voltage limiter range. For example, if the delivered voltage exceeds the limit of 15-8 or falls below the limit of 15-7, then the controller 1130 operates in the voltage limiter mode.

In this example, there are two voltage limiter modes, a standard voltage limiter mode and a fast response voltage limiter mode. The standard voltage limiter mode is bounded by an upper limit 15-6 (approximately 122.0 VAC) and a lower limit 15-5 (approximately 118.0 VAC). If the delivered voltage falls outside of this range of the standard voltage limiter, then controller 1130 operates within the fast response voltage limiter mode. The fast response voltage limiter mode is bounded by an upper limit 15-4 (approximately 125.0 VAC) and a lower limit 15-3 (approximately 115.0 VAC).

The voltage limiter feature is used to place both a high and low limit on the output voltage of the regulator. When enabled, it operates in either the forward or reverse directions and has one of the highest priorities of all operating functions. The voltage limiter can be overridden, but usually only when Auto Operation Blocking Status is set to Blocked, when an operator takes local control, or through an interconnected SCADA system. When the voltage limiter IVVC (integrated volt/var control) settings are used, the voltage limiter also takes priority over remote SCADA tapping operations. The purpose of the voltage limiter is to protect the consumer from abnormally high or low voltages resulting from, for example, large, rapid changes in transmission voltage, abnormal loading of the feeder, inaccurate regulator control settings (e.g., voltage level, bandwidth, line-drop compensation), heavy loading by the first customer while there is a leading power factor on the feeder, and light loading at the first customer with heavy loading on the feeder at the same time. As discussed above, the example controller 1130 described herein can assume some or all of the functions of the voltage limiter.

In one or more example embodiments, example embodiments of voltage regulation for multi-phase power systems can provide real-time adjustment of one or more tap changers in a power system. Example embodiments can be used as part of a new power system or can be used to retrofit an existing power system. Example embodiments can operate using measurements from one or more instrument transformers for two or more phases. For data that is not measured, example embodiments can perform calculations in real time and using other measurements to provide accurate estimates for certain parameters in a power system. Thus, using example embodiments described herein can improve communication, safety, maintenance, costs, and operating efficiency. Example embodiments can be used with electrical power distribution systems (e.g., 7200 VAC) that deliver end-use power (e.g., 120 VAC). Example embodiments can be used during normal operating conditions and/or during times when one or more functions of a voltage limiter are required.

Accordingly, many modifications and other embodiments set forth herein will come to mind to one skilled in the art to which voltage regulation for multi-phase power systems pertain having the benefit of the teachings presented in the foregoing descriptions and the associated drawings. Therefore, it is to be understood that voltage regulation for multi-phase power systems are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. A three-phase electrical power system comprising:
   a first tap changer for a first regulated transformer, wherein the first tap changer has a plurality of first positions for regulating a first voltage between a first electrical phase and a second electrical phase;
   a second tap changer for a second regulated transformer, wherein the second tap changer has a plurality of second positions for regulating a second voltage between the second electrical phase and a third electrical phase;
   at least one first instrument transformer coupled to the first regulated transformer, wherein the at least one first instrument transformer harvests a plurality of first measurements of the first regulated transformer;
   at least one second instrument transformer coupled to the second regulated transformer, wherein the at least one second instrument transformer harvests a plurality of second measurements of the second regulated transformer; and
   a controller coupled to the at least one first instrument transformer and the at least one second instrument transformer, wherein the controller:
      receives the plurality of first measurements from the at least one first instrument transformer and the plurality of second measurements from the at least one second instrument transformer;
      analyzes the plurality of first measurements and the plurality of second measurements;
      determines, based on analyzing the plurality of first measurements and the plurality of second measurements, that an out-of-band condition exists;
      calculates, using the plurality of first measurements and the plurality of second measurements, at least one first setting that results in a substantially equal voltage for the first electrical phase, the second electrical phase, and the third electrical phase; and
      adjusts the first tap changer from a first position to a first adjusted position among the plurality of first positions to correspond to the at least one first setting,
   wherein adjusting the first tap changer to the first adjusted position regulates the first voltage between the first electrical phase and the second electrical phase, regulates a third voltage between the first electrical phase and the third electrical phase, and eliminates the out-of-band condition.

2. The three-phase electrical power system of claim 1, wherein the controller further adjusts the second tap changer from a second position to a second adjusted position among the second plurality of positions based on the plurality of first measurements of the first regulated transformer and the plurality of second measurements of the second regulated transformer.

3. The three-phase electrical power system of claim 1, wherein the first regulated transformer and the second regulated transformer form an open delta configuration.

4. The three-phase electrical power system of claim 1, wherein the at least one first instrument transformer comprises a current transformer.

5. The three-phase electrical power system of claim 1, wherein the at least one first instrument transformer further comprises a potential transformer.

6. The three-phase electrical power system of claim 1, further comprising:
   a third tap changer for a third regulated transformer, wherein the third tap changer has a plurality of third positions; and
   at least one third instrument transformer coupled to the third regulated transformer, wherein the at least one third instrument transformer harvests a plurality of third measurements of the third regulated transformer, wherein the at least one first setting is further calculated using the plurality of third measurements of the third regulated transformer.

7. The three-phase electrical power system of claim 6, wherein the controller further adjusts the third tap changer from the third position to a third adjusted position among the plurality of third positions based on the plurality of first measurements of the first regulated transformer, the plurality of second measurements of the second regulated transformer, and the plurality of third measurements of the third regulated transformer.

8. The three-phase electrical power system of claim 6, wherein the first regulated transformer, the second regulated transformer, and the third regulated transformer form a closed delta configuration.

9. The three-phase electrical power system of claim 6, wherein the first regulated transformer, the second regulated transformer, and the third regulated transformer form a grounded wye configuration.

10. The three-phase electrical power system of claim 1, wherein the controller adjusts the first tap changer from the first position to the first adjusted position based on forward power flows.

11. The three-phase electrical power system of claim 1, wherein the controller adjusts the first tap changer from the first position to the first adjusted position further based on reverse power flows.

12. The three-phase electrical power system of claim 1, wherein the controller adjusts the first tap changer from the first position to the first adjusted position further based on a magnitude of calculated values.

13. The three-phase electrical power system of claim 1, wherein the controller adjusts the first tap changer from the first position to the first adjusted position further based on a phase angle of calculated values.

14. A metering system comprising:
    a first tap changer for a first regulated transformer, wherein the first tap changer has a plurality of first positions for regulating a first voltage between a first electrical phase and a second electrical phase;
    a second tap changer for a second regulated transformer, wherein the second tap changer has a plurality of second positions for regulating a second voltage between the second electrical phase and a third electrical phase;
    at least one first instrument transformer coupled to the first regulated transformer, wherein the at least one first instrument transformer harvests a plurality of first measurements of the first regulated transformer;
    at least one second instrument transformer coupled to the second regulated transformer, wherein the at least one second instrument transformer harvests a plurality of second measurements of the second regulated transformer; and
    a controller coupled to the at least one first instrument transformer and the at least one second instrument transformer, wherein the controller:
        receives the plurality of first measurements from the at least one first instrument transformer and the plurality of second measurements from the at least one second instrument transformer; and
        calculates multi-phase power measurements based on the plurality of first measurements of the first regulated transformer and the plurality of second measurements of the second regulated transformer,
    wherein the multi-phase power measurements calculated by the controller comprise a first regulated voltage between the first electrical phase and the second electrical phase, a second regulated voltage between the second electrical phase and the third electrical phase, and a third regulated voltage between the first electrical phase and the third electrical phase,
    wherein the first regulated voltage corresponds to a first adjusted position of the first tap changer, wherein the second regulated voltage corresponds to a second adjusted position of the second tap changer,
    wherein the first regulated voltage, the second regulated voltage, and the third regulated voltage are substantially equal when the first tap changer is in the first adjusted position and when the second tap changer is in the second adjusted position.

15. A method for regulating voltage of a plurality of regulated transformers in a three-phase electrical power system, the method comprising:
    receiving, by a controller from at least one first instrument transformer coupled to a first regulated transformer of the plurality of regulated transformers, a plurality of first measurements of the first regulated transformer;
    receiving, by the controller from at least one second instrument transformer coupled to a second regulated transformer of the plurality of regulated transformers, a plurality of second measurements of the second regulated transformer;
    determining, by the controller, that at least one first measurement of the plurality of first measurements is outside of a range of operating values;
    calculating, by the controller and using the plurality of first measurements and the plurality of second measurements, at least one setting that results in a substantially equal voltage for a first electrical phase, a second electrical phase, and a third electrical phase; and
    adjusting, by the controller, a first tap changer of the first regulated transformer from a first position to a first adjusted position among a plurality of first positions to correspond to the at least one setting,
    wherein adjusting the first tap changer to the first adjusted position regulates a first voltage between a first electrical phase and a second electrical phase, regulates a third voltage between the first electrical phase and the third electrical phase, and moves the at least one first measurement of the plurality of first measurements back within the range of operating values.

16. The method of claim 15, further comprising:
adjusting, by the controller, a second tap changer of the second regulated transformer from a second position to a second adjusted position among a plurality of second positions to correspond to the at least one setting.

17. The method of claim 15, further comprising:
adjusting, by the controller, a third tap changer of the third regulated transformer from a third position to a third adjusted position among a plurality of third positions to correspond to the at least one first setting.

18. The method of claim 15, further comprising:
suspending, by the controller, further adjustments when the first tap changer is adjusted;
evaluating, by the controller, the plurality of first measurements and the plurality of second measurements received after adjusting the first tap changer;
determining, by the controller, that the plurality of first measurements and the plurality of second measurements received after adjusting the first tap changer indicate a stable system; and enabling, by the controller, further adjustments based on the plurality of first measurements and the plurality of second measurements.

19. The method of claim 15, wherein the range of operating values comprises at least one of a group consisting of a range of normal operating values, a standard voltage limiter range, and a fast response voltage limiter range.

* * * * *